(12) United States Patent
Kanno et al.

(10) Patent No.: US 7,572,718 B2
(45) Date of Patent: Aug. 11, 2009

(54) SEMICONDUCTOR DEVICE AND MANUFACTURING METHOD THEREOF

(75) Inventors: Yohei Kanno, Kanagawa (JP); Yasuko Watanabe, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 56 days.

(21) Appl. No.: 11/092,773

(22) Filed: Mar. 30, 2005

(65) Prior Publication Data

US 2005/0230752 A1   Oct. 20, 2005

(30) Foreign Application Priority Data

Apr. 19, 2004   (JP) .............................. 2004-122388

(51) Int. Cl.
   *H01L 21/3205* (2006.01)
(52) U.S. Cl. .......................... 438/585; 438/660; 257/72
(58) Field of Classification Search ........................ None
   See application file for complete search history.

(56) References Cited

U.S. PATENT DOCUMENTS

| | | | |
|---|---|---|---|
| 6,365,917 B1 * | 4/2002 | Yamazaki ..................... | 257/72 |
| 6,590,230 B1 | 7/2003 | Yamazaki et al. | |
| 6,750,618 B2 | 6/2004 | Yamazaki et al. | |
| 6,861,377 B1 * | 3/2005 | Hirai et al. .................. | 438/781 |
| 2001/0041392 A1 * | 11/2001 | Suzawa et al. .............. | 438/149 |
| 2002/0014634 A1 * | 2/2002 | Koyama et al. ............. | 257/192 |
| 2003/0059975 A1 * | 3/2003 | Sirringhaus et al. .......... | 438/99 |
| 2004/0147113 A1 | 7/2004 | Yamazaki et al. | |
| 2004/0266073 A1 | 12/2004 | Yamazaki | |
| 2005/0013927 A1 | 1/2005 | Yamazaki | |

FOREIGN PATENT DOCUMENTS

| | | |
|---|---|---|
| JP | 10-135468 | 5/1998 |
| JP | 11-326951 | 11/1999 |
| WO | WO 2004/070809 | 8/2004 |
| WO | WO 2004/070822 A1 | 8/2004 |

* cited by examiner

*Primary Examiner*—Evan Pert
*Assistant Examiner*—Ben P Sandvik
(74) *Attorney, Agent, or Firm*—Nixon Peabody LLP; Jeffrey L. Costellia

(57) ABSTRACT

In the case of providing an LDD region for a TFT, it is necessary to form separately an insulating film to be a mask or to contrive the shape of a gate electrode layer in order to have the concentration difference in impurities injected in a semiconductor film; therefore, the number of patterning steps has increased as a matter of course and the step has become complicated. A semiconductor device according to one feature of the invention comprises a semiconductor layer including a channel region, a pair of impurity regions, and a pair of low-concentration impurity regions; and a gate electrode layer having a single layer structure or a laminated structure, of which film thickness is not even, which is formed to be in contact with the semiconductor layer by sandwiching a gate insulating film therebetween. Particularly, the gate electrode layer, of which film thickness is not even, can be formed easily by employing a droplet discharging method; thus, the convenience of the droplet discharging method can be taken with full advantage.

27 Claims, 21 Drawing Sheets

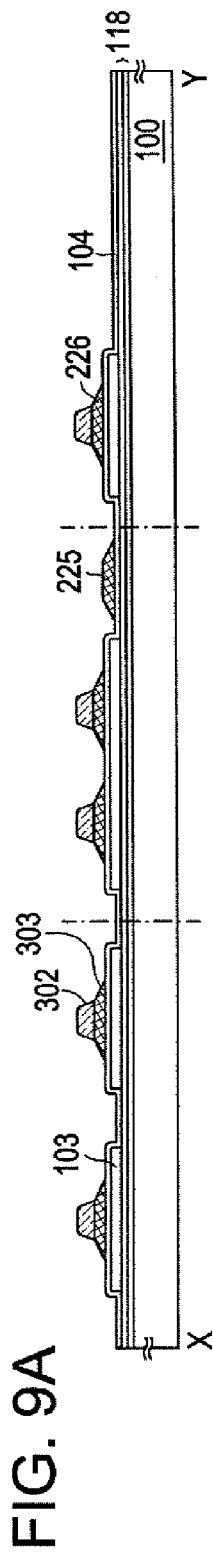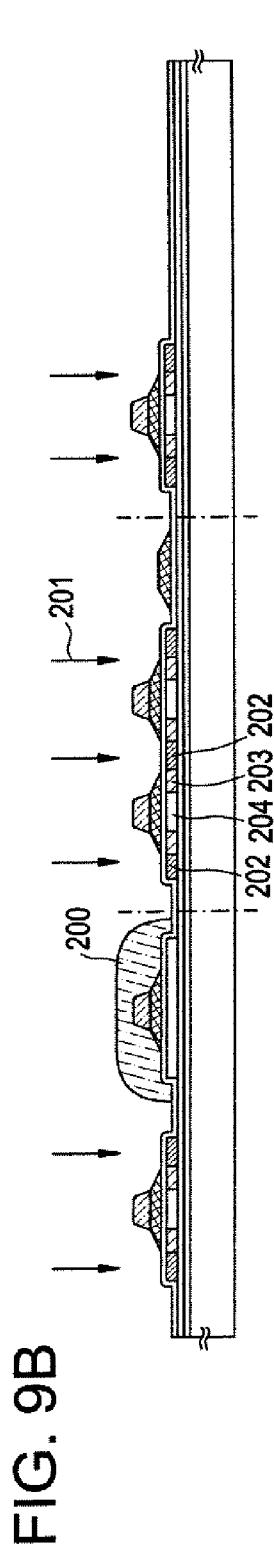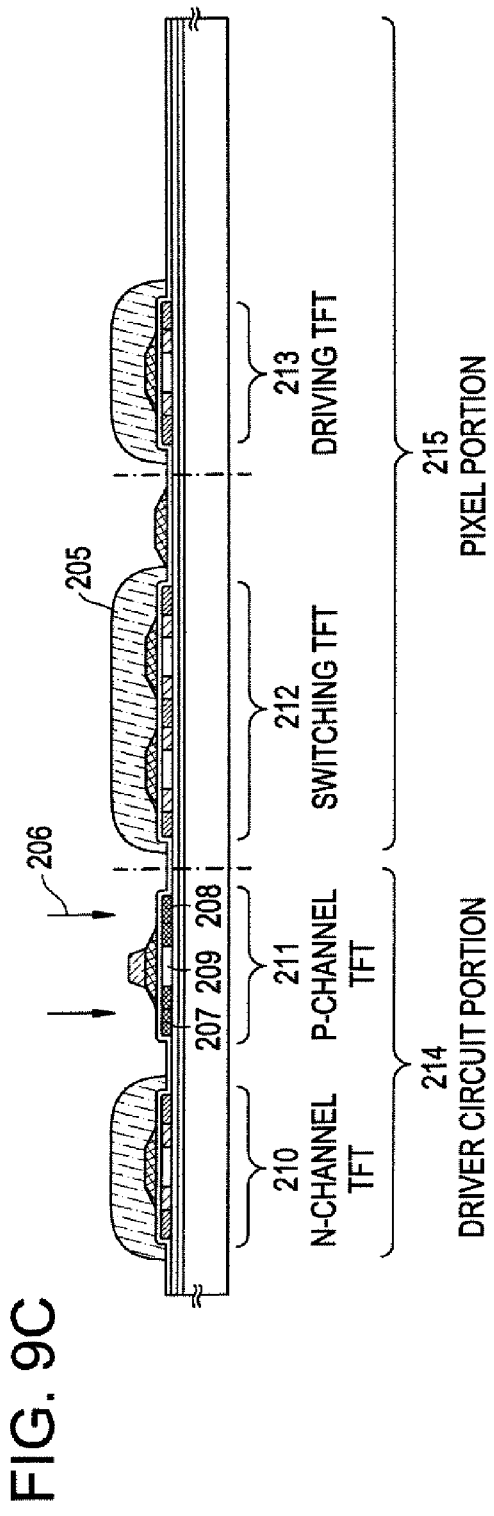

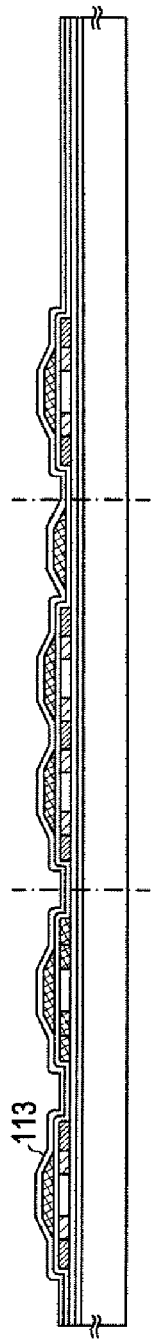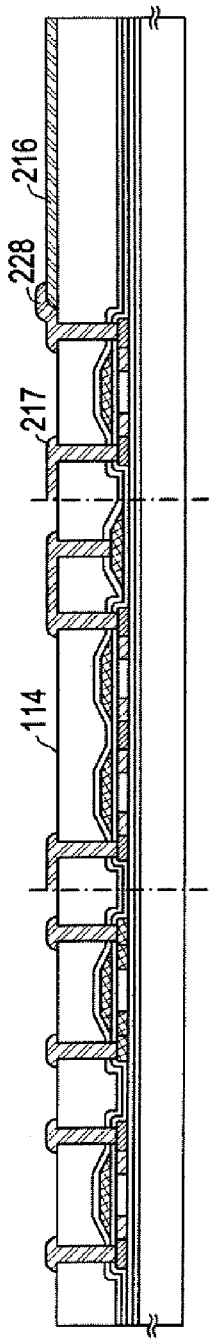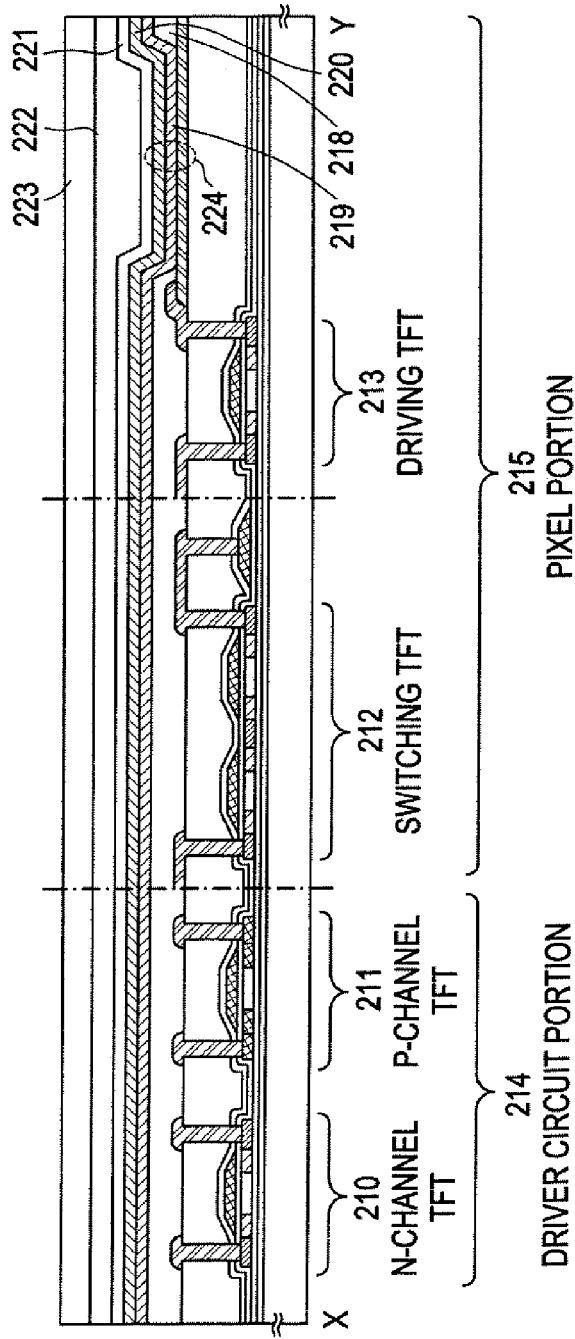

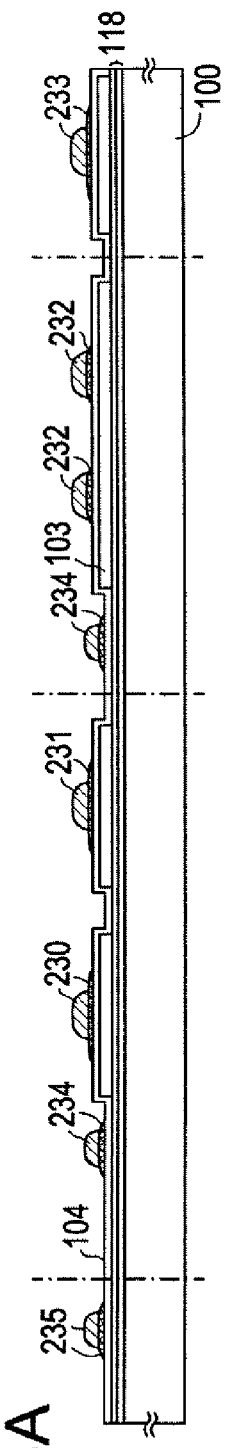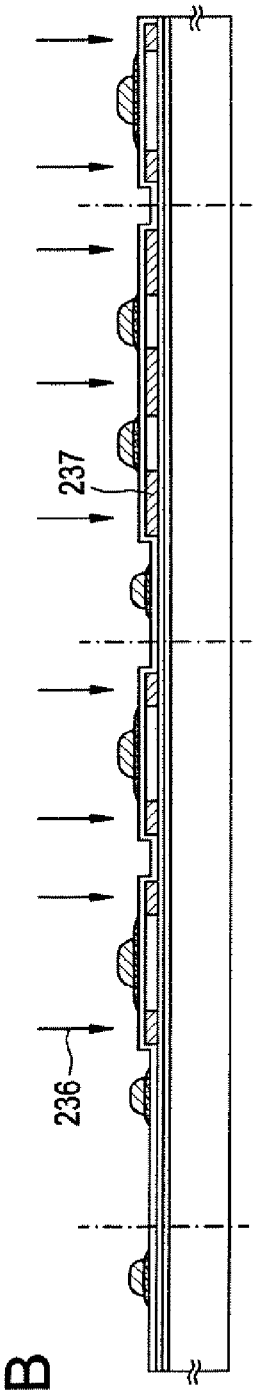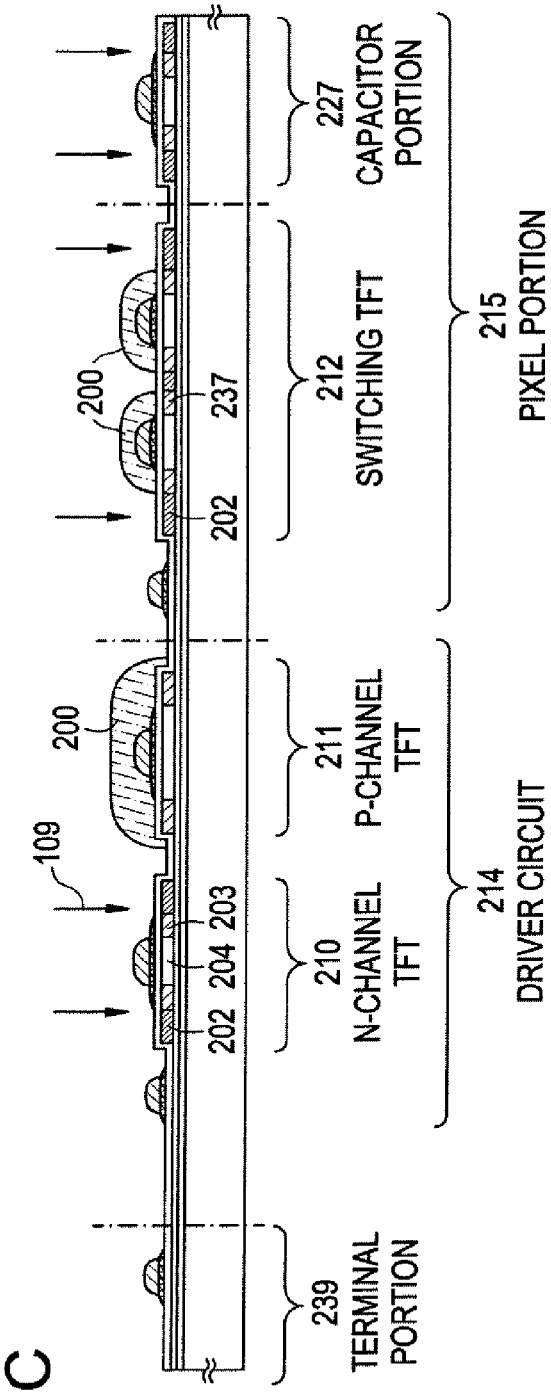

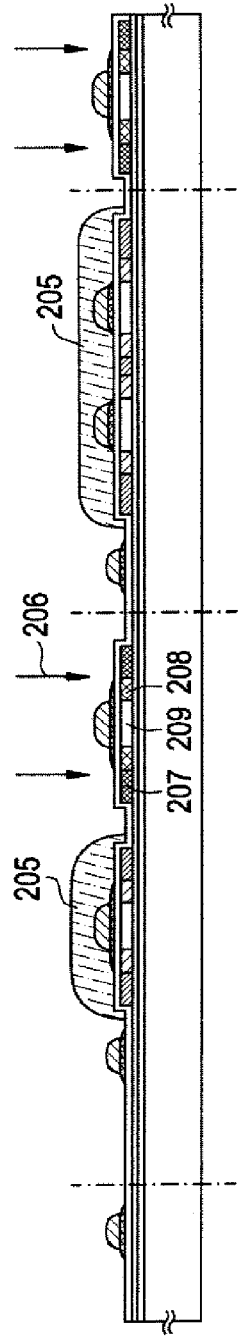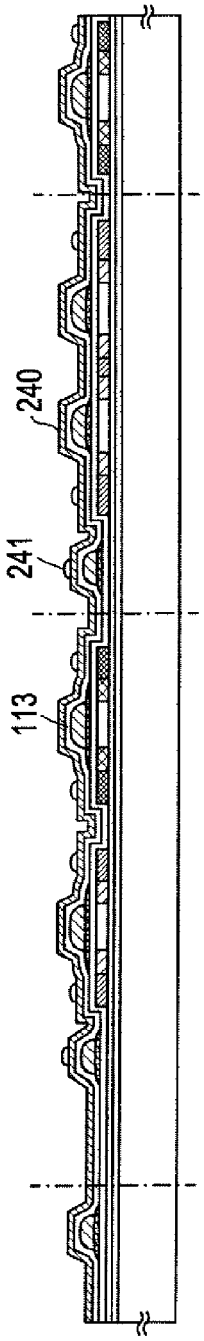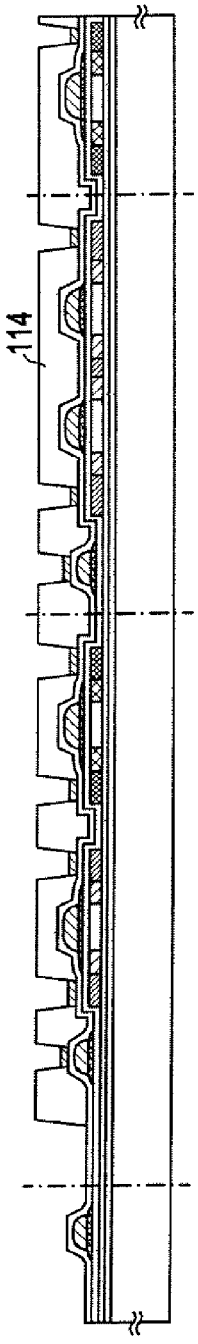

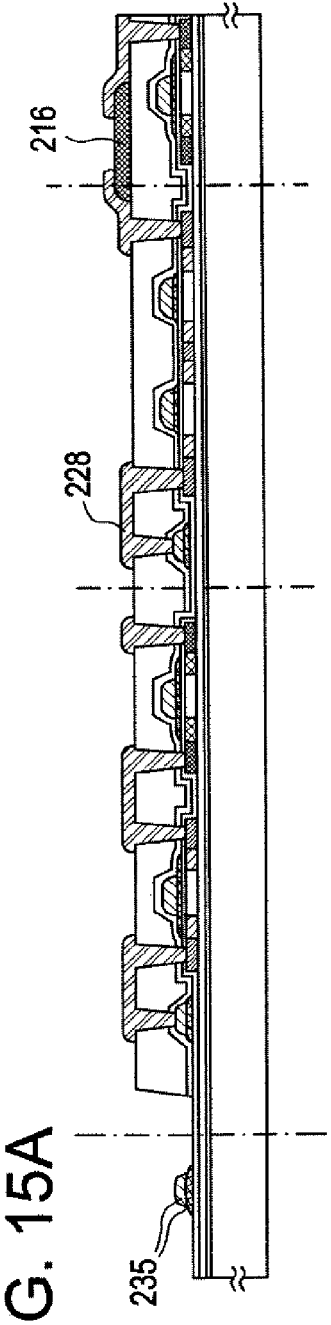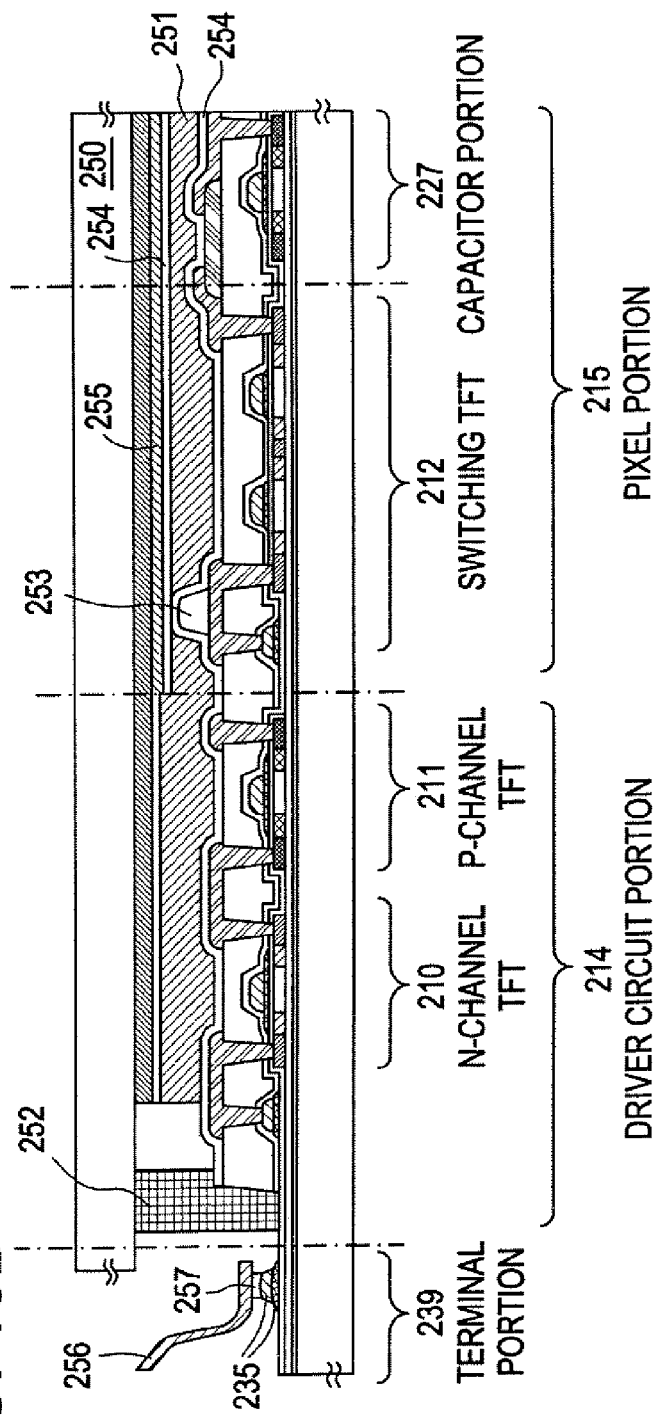

FIG. 20A
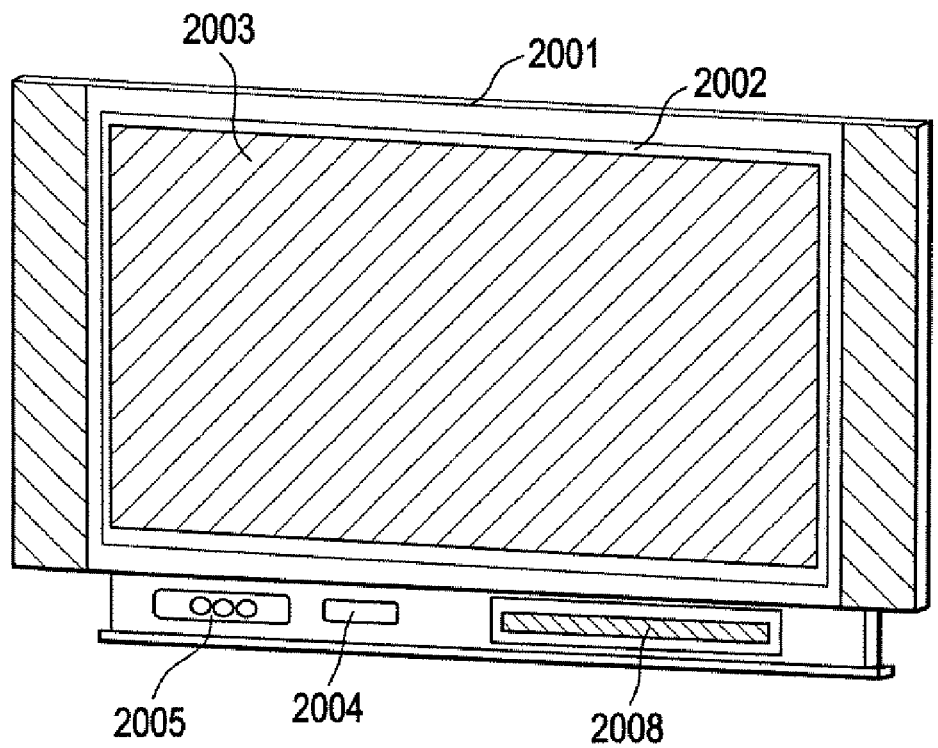
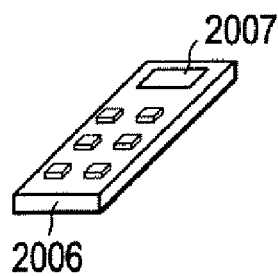

SEMICONDUCTOR DEVICE AND MANUFACTURING METHOD THEREOF

BACKGROUND OF THE INVENTION

1. Field of the Invention

The present invention relates to an active element such as a transistor formed over a large-sized glass substrate, a liquid crystal display device (hereinafter also referred to as a "LCD") and an EL display device containing the active element, and a manufacturing method thereof. Particularly, the invention relates to a thin film transistor, a liquid crystal display device, and an EL display device using a droplet discharging method typified by an ink-jet method, and a manufacturing method thereof.

2. Description of the Related Art

Conventionally, a so-called active matrix driving liquid crystal display panel including a thin film transistor (hereinafter also referred to as a "TFT") over a glass substrate has been manufactured by patterning various thin films according to a light-exposure step using a photomask in the same manner as a manufacturing technique of a semiconductor integrated circuit.

A manufacturing technique to carry out mass production efficiently has been employed up to now by dividing one mother glass substrate into a plurality of liquid crystal display panels. The mother glass substrate has enlarged from a size of 300 mm×400 mm of the first generation at the beginning of the 1990s to a size of 680 mm×880 mm or 730 mm×920 mm of the fourth generation in 2000; thus, the manufacturing technique has developed so that a number of display panels can be obtained from one substrate.

When the size of a glass substrate or a display panel is small, patterning treatment can be performed comparatively easily by using a photolithography apparatus. However, an entire surface of a display panel cannot be simultaneously treated by performing light-exposure treatment once as a substrate becomes larger. Consequently, a method or the like for dividing a region where a photoresist is coated into a plurality of regions, performing light-exposure treatment on every predetermined block regions, and exposing an entire surface of a substrate to light by sequentially repeating the treatment has been developed (for example, see Reference 1, Japanese Patent Laid Open No. H11-326951).

In addition, a technique to provide a comparatively low-concentration impurity region (LDD region: Lightly Doped Drain region) formed at the ends of a source and/or drain region in order to relax an electric field concentrated at the ends of the drain regions of a plurality of TFTs and to suppress a so-called hot carrier (hot electron or hot hole) effect is used when an active matrix substrate including the plurality of TFTs which is used for an active matrix LCD or an EL display device is formed (for example, see Reference 2, Japanese Patent Laid Open No. H10-135468).

However, a glass substrate is further enlarged to a size of 1000 mm×1200 mm or 1100 mm×1300 mm in the fifth generation, a size of 1500 mm×1800 mm in the sixth generation, a size of 2000 mm×2200 mm in the seventh generation, and a size of 2500 mm×3000 mm or more is assumed in the eighth generation. It is difficult to manufacture a display panel with good productivity with low cost only by a conventional patterning method. In other words, when a plurality of times of light-exposure is performed by consecutive light exposure, a processing time is increased and it is difficult to handle large substrates.

In addition, in the case of providing an LDD region for a TFT, it is necessary to form separately an insulating film to be a mask or to contrive the shape of a gate electrode layer in order to have the concentration difference in impurities injected in a semiconductor film; therefore, the number of patterning steps has increased as a matter of course and the step has become complicated. As the number of the steps increases, naturally, the cost for running an apparatus and the material cost run up, and there is a problem that a large amount of waste solution containing heavy metal, insulator, or the like is required to be disposed.

SUMMARY OF THE INVENTION

In view of such problems, it is an object of the present invention to provide a semiconductor device, which can be manufactured in a simplified step, typified by a TFT, a liquid crystal display device and an EL display device including the semiconductor device, and a manufacturing method thereof. Particularly, it is an object of the invention to provide a semiconductor device using a TFT having an LDD region and a liquid crystal display device and an EL display device including the semiconductor device in a simplified step.

In order to solve the above problem, a semiconductor device according to one feature of the invention comprises a semiconductor layer including a channel region, a pair of impurity regions, and a pair of low-concentration impurity regions; and a gate electrode layer having a single layer structure or a laminated structure, of which film thickness is not even, which is formed to be in contact with the semiconductor layer by sandwiching a gate insulating film therebetween.

The pair of low-concentration impurity regions is formed to overlap with a thinner region in the gate electrode layer of which film thickness is not even.

In addition, in order to solve the above problems, a method for manufacturing a semiconductor device according to another feature of the invention comprises the steps of forming a gate insulating film over a semiconductor layer, forming a gate electrode layer having a single layer structure or a laminated structure of which film thickness is not even over the gate insulating film, and forming a pair of impurity regions and a pair of low-concentration impurity regions by introducing impurities into the semiconductor layer, using the gate electrode layer as a mask.

The pair of low-concentration impurity regions is formed to overlap with a thin region in the gate electrode layer of which film thickness is not even.

Furthermore, in order to solve the above problems, a method for manufacturing a semiconductor device according to another feature of the invention comprises the steps of forming a gate insulating film over a semiconductor layer, forming a gate electrode layer over the gate insulating film, introducing impurity elements at different concentration into the semiconductor layer by utilizing change of a width before and after baking the gate electrode layer, and forming a pair of impurity regions and a pair of low-concentration impurity regions.

Since the invention has a feature to include a gate electrode layer having a single layer structure or a laminated structure of which film thickness is not even, a low-concentration impurity region can be formed easily by utilizing the difference in film thickness of the gate electrode layer. In addition, it is possible to manufacture an impurity region and a low-concentration impurity region simultaneously by doping an impurity element once. Accordingly, a semiconductor device can be formed easily as a TFT having a structure in which a gate electrode layer and a low-concentration impurity region are overlapped (a Lov structure).

In addition, the invention has a feature to include a gate electrode layer having a single layer structure or a laminated structure of which film thickness is not even, and such gate electrode layer can be formed easily by particularly employing a droplet discharging method; thus, the convenience of the droplet discharging method can be taken with full advantage.

Furthermore, according to the invention, steps can be simplified and the material cost can be reduced by employing a droplet discharging method actively; and a semiconductor device with high throughput and high yield, and a light-emitting device (typically, an EL display device) and a liquid crystal display device including the semiconductor device can be provided. Particularly, a display panel can be manufactured at good productivity with low cost even when a size of a glass substrate becomes larger like the sixth generation (1500 mm×1800 mm), the seventh generation (2000 mm×2200 mm), the eighth generation (2500 mm×3000 mm), or more. In addition, it is not necessary to dispose a large amount of waste solution containing heavy metal or the like as a conductive material; thus, the invention is significant also in terms of environmental concerns.

These and other objects, features and advantages of the present invention will become more apparent upon reading of the following detailed description along with the accompanied drawings.

BRIEF DESCRIPTION OF THE DRAWINGS

FIGS. 9A to 9C are views of a step of manufacturing a light-emitting device according to certain aspects of the present invention;

FIGS. 10A to 10C are views of a step of manufacturing a light-emitting device according to certain aspects of the present invention;

FIGS. 13A to 13C are views of a step of manufacturing a liquid crystal display device according to certain aspects of the present invention;

FIGS. 14A to 14C are views of a step of manufacturing a liquid crystal display device according to certain aspects of the present invention;

FIGS. 15A and 15B are views of a step of manufacturing a liquid crystal display device according to certain aspects of the present invention;

FIGS. 20A to 20C are views each showing one example of electronic devices manufactured according to certain aspects of the present invention.

DETAILED DESCRIPTION OF THE INVENTION

Embodiment Modes of the present invention will be described below with reference to the accompanying drawings. However, various modes will be applicable to the invention and various changes and modifications will be apparent unless such changes and modifications depart from the purpose and scope of the invention. For example, the invention can be carried out by appropriately combining each of embodiment modes and embodiments.

In addition, the invention provides a method for manufacturing all semiconductor devices, a method for manufacturing a liquid crystal display device, and a method for manufacturing an EL display device by actively using a mask-less process such as a droplet discharging method. However, not all steps are required to be performed by a mask-less process but a mask-less process is desirable to be included at least in part of the steps. Therefore, hereinafter, even in the case of a step performed only with a droplet discharging method, the droplet discharging method can be replaced with other manufacturing methods used in the conventional patterning step and the like.

Embodiment Mode 1

This embodiment mode describes one embodiment mode of a structure of a semiconductor device and a manufacturing method thereof according to the present invention with reference to FIGS. 1A to 1D and FIGS. 2A to 2D. Herein, a top gate TFT is given as an example to describe the embodiment mode.

Figure 1A:
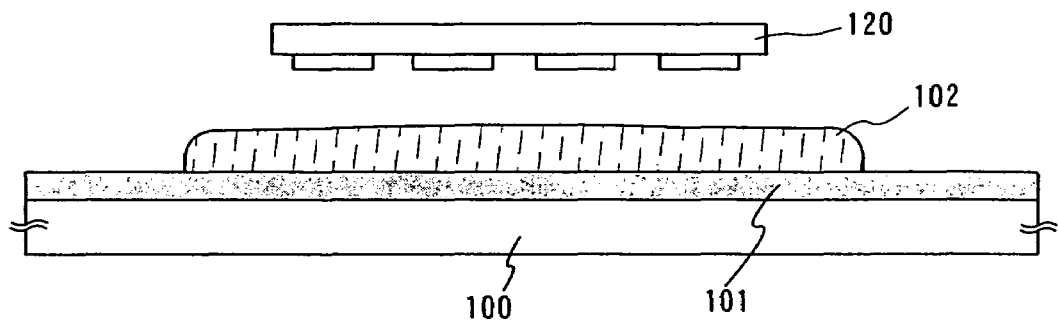
FIGS. 1A to 1D are explanatory cross-sectional views of a semiconductor device according to certain aspects of the present invention and a manufacturing method thereof.

First, a semiconductor layer 101 is formed over a substrate 100 (FIG. 1A). The semiconductor layer 101 is formed of an amorphous semiconductor, a crystalline semiconductor, or a semi-amorphous semiconductor. In any cases, a semiconductor film containing silicon, silicon germanium (SiGe), or the like as the main component can be used. In addition, the semi-amorphous semiconductor particularly containing silicon as the main component is referred to as SAS (semi-amorphous silicon) or microcrystalline silicon. The semiconductor layer 101 can be formed by a CVD method, a sputtering method, or the like. Note that it is desirable that the film thickness of the semiconductor layer 101 ranges from 10 nm to 100 nm. Alternatively, the semiconductor layer 101 may be formed by using a substrate such as a silicon wafer or an SOI substrate (a SIMOX substrate and the like).

When the crystalline semiconductor film is used, after processing an amorphous semiconductor film with a solution containing catalyst such as nickel, a crystalline semiconductor film is obtained by a heat crystallization step at temperatures from 500° C. to 750° C., and further by improving the crystallinity after laser crystallization. In addition, a crystalline semiconductor film can also be obtained by directly forming a polycrystalline semiconductor film by an LPCVD (low-pressure CVD) method, using disilane ($Si_2H_6$) and germanium fluoride ($GeF_4$) as a source gas. The gas flow rate of $Si_2H_6/GeF_4$ is equal to 20/0.9, the deposition temperature is set to be from 400° C. to 500° C., and He or Ar is used for the carrier gas; however, the gas flow rate, deposition temperature, and carrier gas are not limited thereto.

Note that a glass substrate, a quartz substrate, a substrate made of an insulating material such as alumina, a heat-resistant plastic substrate that can withstand the processing temperature in the post-process, or the like can be used for the substrate 100. In this case, it is desirable to form a base insulating film of silicon oxide (SiOx), silicon nitride (SiNx), silicon oxynitride (SiOxNy) (x>y), silicon nitride oxide (SiNxOy) (x>y) (x, y=1, 2 . . . ), or the like in order to prevent impurities or the like from diffusing through the substrate side. Alternatively, a substrate made of metal such as stainless steel or a semiconductor substrate whose surface is provided with an insulating film of silicon oxide, silicon nitride, or the like can also be used.

Figure 1B:
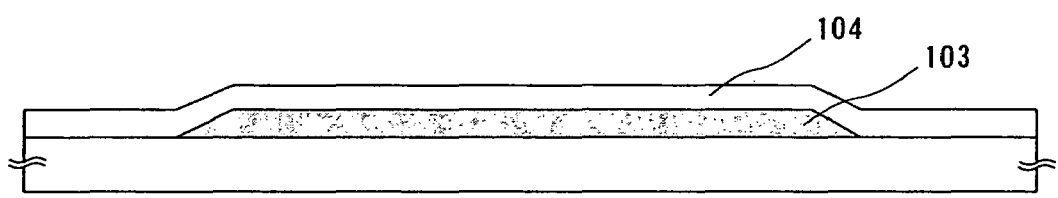

Next, a resist 102 is formed over the semiconductor layer 101 (FIG. 1A). It is desirable to form the resist 102 by discharging a composition containing a resist material from a nozzle 120. However, the resist 102 may be formed by patterning in the conventional manner. Then, an island-shaped semiconductor layer 103 is formed by etching the semiconductor layer 101, using the resist 102 as a mask (FIG. 1B). A chlorine-based gas typified by $Cl_2$, $BCl_3$, $SiCl_4$, or $CCl_4$; a fluorine-based gas typified by $CF_4$, $SF_6$, $NF_3$, $CHF_3$; or $O_2$ is used for the etching gas, which is not limited thereto. Note that the etching may utilize atmospheric pressure plasma.

Next, a gate insulating film 104 is formed over the island-shaped semiconductor layer 103 (FIG. 1B). All insulating films of silicon oxide (SixOy, for example, $SiO_2$), silicon nitride (SixNy, for example, $Si_3N_4$), silicon oxynitride (SiOxNy or SiNxOy), alumina ($Al_2O_3$), tantalum oxide ($Ta_2O_5$), lanthanum oxide ($La_2O_3$), hafnium oxide ($HfO_2$), zirconium oxide ($ZrO_2$), silicate (ZrAlxOy), aluminate (HfAlxOy), or the like can be utilized for the gate insulating film. Alternatively, a structure in which two layers or more of such materials are laminated may be employed.

Figure 1C:
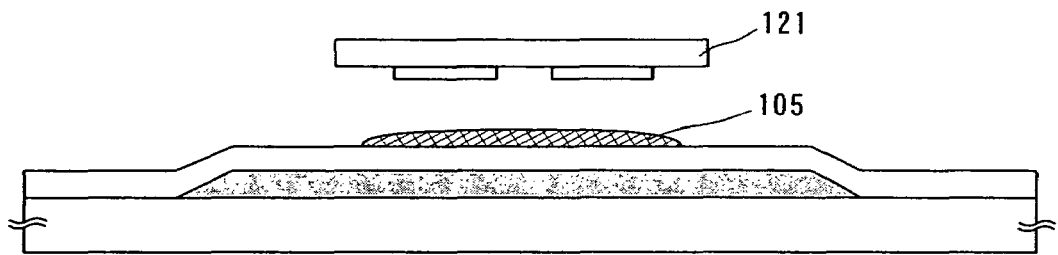

Next, a first gate electrode layer 105 is formed by discharging a composition containing a first conductive material over the gate insulating film 104 by a droplet discharging method, using a nozzle 121 (FIG. 1C).

Figure 1D:
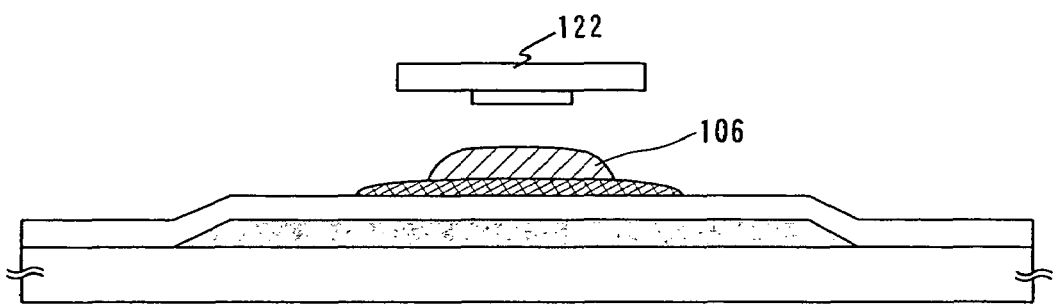

Next, a second gate electrode layer 106 is formed by discharging a composition containing a second conductive material over the first gate electrode layer 105 by a droplet discharging method, using a nozzle 122 (FIG. 1D). Herein, the width of the second gate electrode layer 106 is made narrower than that of the first gate electrode layer 105 as shown in FIG. 1D. Alternatively, the width of the second gate electrode layer 106 may be made wider than that of the first gate electrode layer 105 so that the second gate electrode layer 106 covers the first gate electrode layer 105 completely.

In any cases, a low-concentration impurity region is formed in a step of doping an impurity element to be subsequently described through the first gate electrode layer 105.

Although the different nozzles 121 and 122 are used here to form the first and second gate electrode layers, the same nozzle may be used to form the first and second gate electrode layers by changing the discharge conditions.

There is no particular limitation on the film thickness of the first and second gate electrode layers. However, when the width of the second gate electrode layer 106 is made narrower than that of the first gate electrode layer 105, it is desirable that the first gate electrode layer 105 is formed to be as thin as possible so that impurities are easily injected into the semiconductor layer and that the second gate electrode layer 106 is formed to be as thick as possible so that the impurities are not injected into a channel region. On the other hand, it is desirable to reverse the above in the case of making the width of the second gate electrode layer 106 wider than that of the first gate electrode layer 105. Note that the first and second gate electrode layers may employ a laminated structure so that the impurities are not injected into the channel region.

Note that the droplet discharging method means a method for forming a predetermined pattern by discharging a composition containing a predetermined conductive material from a minute hole. An ink-jet method is typically given as an example thereof; however, the droplet discharging method is not limited to the ink-jet method, and a dispenser method, a screen printing method, an offset printing method, and the like are included, too. Hereinafter, all materials that can be discharged and formed by a droplet discharging method such as a semiconductor material, an organic semiconductor material, an insulating material (including both an organic insulating material and an inorganic insulating material), an organic material, or an inorganic material is included except the conductive material as the composition. Herein, an orientation film, a color filter, and a spacer of an LCD; and a light-emitting layer, an electron transport layer, an electron injection layer, a hole transport layer, a hole injection layer, a color filter, and the like of an EL light-emitting element are given as a typical example which is made of the organic material and the inorganic material. Hereinafter, the composition containing any one of these materials may be referred to as an ink, a droplet, or a paste (referred to as a nano paste particularly in the case of including a material in a size of a nanometer (nm) order).

In addition, various materials can be selected as the first or second conductive material depending on the function of the conductive film. Typically, the following can be used: AgCu, Au, Ni, Pt, Cr, Al, W, Ta, Mo, Zn, Fe, In, Ti, Si, Ge, tin (Sn), palladium (Pd), iridium (Ir), rhodium (Rh), ruthenium (Ru), rhenium (Re), tellurium (Te), cadmium (Cd), zirconium (Zr), barium (Ba), antimonial lead, tin oxide antimony, fluoride doped zinc oxide, carbon, graphite, glassy carbon, lithium, beryllium, sodium, magnesium, potassium, calcium, scandium, manganese, zirconium, gallium, niobium, a sodium-potassium alloy, a magnesium-copper mixture, a magnesium-silver mixture, a magnesium-aluminum mixture, a magnesium-indium mixture, an aluminum-aluminum oxide mixture, a lithium-aluminum mixture, or the like; particles or the like of silver halide or dispersible nanoparticles; or indium tin oxide (ITO) used as a transparent conductive film, ITSO (Indium Tin Silicon Oxide) which is a conductive material in which silicon or silicon oxide is contained in ITO, zinc oxide (ZnO), zinc oxide added with gallium (GZO), indium zinc oxide (IZO) in which zinc oxide of from 2% to 20% is mixed into indium oxide, organic indium, organic tin, titanium nitride, an Al—C—Ni alloy, or the like.

In the case of using copper, a barrier film is preferably provided as well for a countermeasure against impurity. Ester such as butyl acetate or ethyl acetate, alcohols such as isopropyl alcohol or ethyl alcohol, an organic solvent such as methyl ethyl ketone or acetone, or the like may be used for a solvent. Herein, an insulating or conductive substance containing nitrogen such as silicon nitride, silicon oxynitride, aluminum nitride, titanium nitride, or tantalum nitride (TaN), which may be formed by a droplet discharging method, is preferably used for the barrier film in the case of using copper as a wiring.

Although the first and second gate electrode layers are formed here from different materials (for example, TaN for the first gate electrode layer and W for the second gate electrode layer), the first and second gate electrode layers may be formed from the same material. In addition, the materials may be changed appropriately depending on the line width and length of the gate electrode layers. For example, an inexpensive material such as Cu or Al can be used for a region with comparatively large area like the first gate electrode layer, and low-resistant Ag can be used for the second gate electrode layer in FIGS. 1C and 1D.

It is preferable to set the diameter of each nozzle for discharging the composition to be from 0.1 μm to 50 μm (preferably, from 0.6 μm to 26 μm) and to set the amount of the composition discharged from each nozzle to be from 0.00001 pl to 50 pl (preferably, from 0.0001 pl to 40 pl). This discharged amount increases in proportion to the size of the nozzle diameter. In addition, a distance between a subject and a nozzle outlet is preferably brought as close as possible to drop a droplet at a desired place, which is preferably set to be approximately from 0.1 mm to 2 mm. The discharge amount can also be controlled by changing a pulse voltage applied to a piezoelectric element. It is desirable to set these discharge conditions so that the line width of the gate electrode layers is each 10 μm or less.

Note that the viscosity of the composition used for a droplet discharging method is preferably 300 mPa·s or less. This prevents the composition from drying and thus the compositions can be discharged from the outlet smoothly. Note that the viscosity, surface tension, and the like of the composition are preferably appropriately adjusted depending on a solvent to be used and the usage. For example, the viscosity of a composition in which ITO, ITSO, organic indium, or organic tin is dissolved or dispersed in a solvent is from 5 mPa·s to 50 mPa·s; the viscosity of a composition in which silver is dissolved or dispersed in a solvent is from 5 mPa·s to 20 mPa·s; and the viscosity of a composition in which gold is dissolved or dispersed in a solvent is from 10 mPa·s to 20 mPa·s.

Although depending on the diameters of each nozzle and the desired shape of the pattern, the diameter of particles for the conductive material is preferably as small as possible for preventing clogged nozzles and of manufacturing a precise pattern. The diameter of the particles is preferably 0.1 μm or less. The composition is formed by a known method such as an electrolytic method, an atomization method, or a wet reducing method, and a particle size thereof is typically approximately from 0.5 μm to 10 μm. When the composition is formed by a gas evaporation method, each nanometer-scale molecular protected with a dispersing agent is minute and is approximately 7 nm in size. In addition, when each surface of nanometer particles is covered with a coating, the nanometer particles among the solvent are not agglutinated to each other and the nanometer particles are uniformly dispersed in the solvent at a room temperature, thereby exhibiting behavior similar to that of aqueous fluid. As a result, the coating is preferably used.

Figure 19A:
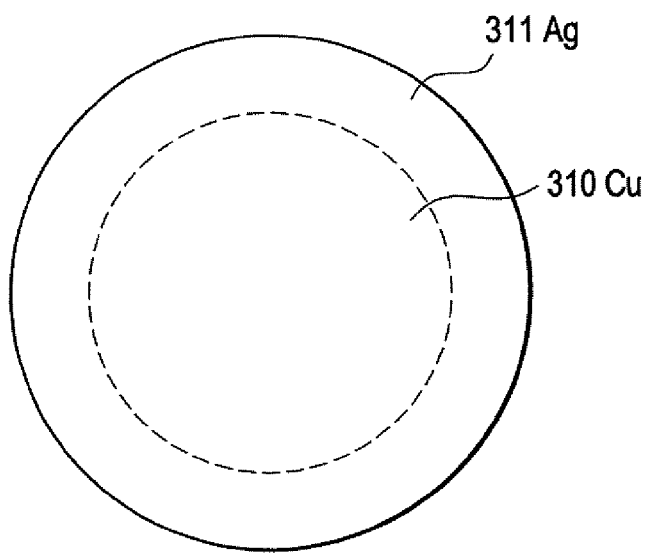
FIGS. 19A and 19B are explanatory views of a structure of conductive particles.
Figure 19B:
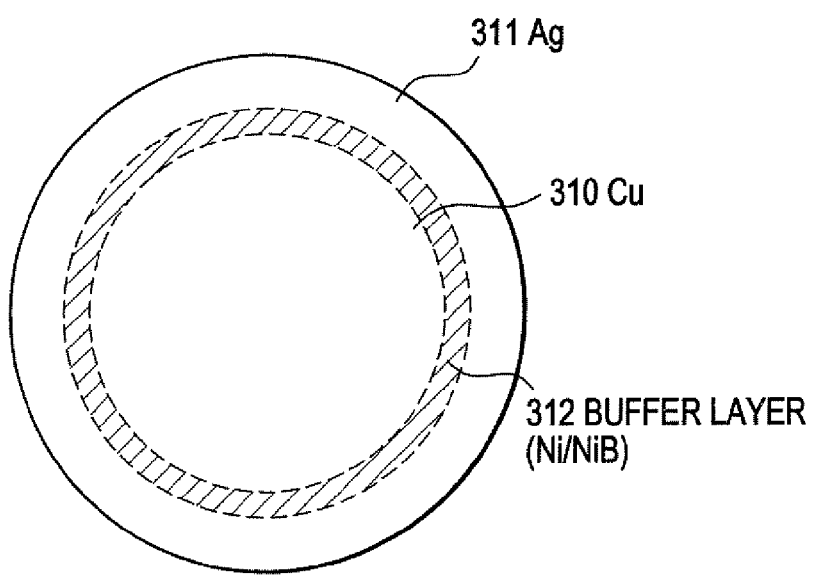

In addition, the gate electrode layers may also be formed by discharging a composition containing particles where the circumference of one conductive material is covered with other conductive material. For example, a particle where the circumference of Cu 310 is covered with Ag 311 (FIG. 19A) may have, for example, a structure in which a buffer layer 312 made of Ni or NiB (nickel boron) is provided between the Cu 310 and the Ag 311.

Generally, the first and second gate electrode layers are formed by performing heat treatment after discharging the above compositions. For example, the gate electrode layers are formed by performing drying at 100° C. for 3 minutes and further by performing baking at temperatures from 200° C. to 350° C. for 15 minutes to 30 minutes in an atmosphere containing nitrogen and/or oxygen. This heat treatment may be performed after discharging each of the first conductive material and the second conductive material or may be performed at a time after discharging both the first conductive material and the second conductive material.

In the case of forming a gate electrode layer by a droplet discharging method, a mechanism in which the film thickness of the gate electrode layer decreases due to heat treatment thereafter is described here.

In the case of forming the gate electrode layers by a droplet discharging method, a composition (droplet) discharged from a nozzle is generally a conductive material for forming the gate electrode layer dispersed or dissolved in an organic solvent, and contains a dispersant or a thermosetting resin referred to as a binder. Here, the dispersant has a function of distributing conductive particles in the solvent uniformly and the binder has a function of preventing generation of crack or uneven baked state during baking. According to the drying and baking steps, evaporation of the organic solvent, degradation and removal of the dispersant, and hardening and shrinkage of the binder are performed simultaneously; therefore, conductive particles makes fusion with each other to be hardened. In this case, the conductive particles are grown from several tens nm to several hundreds nm. The grown particles close to each other makes welding to connect in chain to each other to form a chained metal body. On the other hand, almost all remaining organic component (approximately from 80% to 90%) is pushed to outside of the chained metal body. As a result, a conductive film containing the chained metal body (a gate electrode layer) and a layer made of an organic component covering the surface of the conductive film (hereinafter, just referred to as an "organic layer") are formed.

Then, when a conductive paste is baked in the atmosphere containing nitrogen and oxygen, oxygen contained in a gas (including oxygen contained in the heating atmosphere as an atmospheric constituent) is reacted with carbon, hydrogen, or the like contained in the organic layer; therefore, the organic layer can be removed. In addition, when oxygen is not contained in the baking atmosphere, the organic layer film can be removed by additionally performing oxygen plasma treatment or the like.

In this manner, the organic layer is removed by baking a conductive paste in the atmosphere containing nitrogen and/or oxygen or by performing oxygen plasma treatment after drying. Therefore, one of the gate electrode layers is reduced in film thickness and width and the other, which remains, can be made smoothed, thin, or reduced in electric resistance.

Since a solvent in a composition containing a conductive material volatilizes by discharging the composition in the low pressure, the time for subsequent heat treatment (drying or baking) can be shortened. When the composition ratio of oxygen in the atmosphere is set to be from 10% to 25%, the gate electrode layer can be reduced efficiently in film thickness and width. In addition, the gate electrode layer can be further made smoothed, thin, or reduced in electric resistance.

Figure 2A:
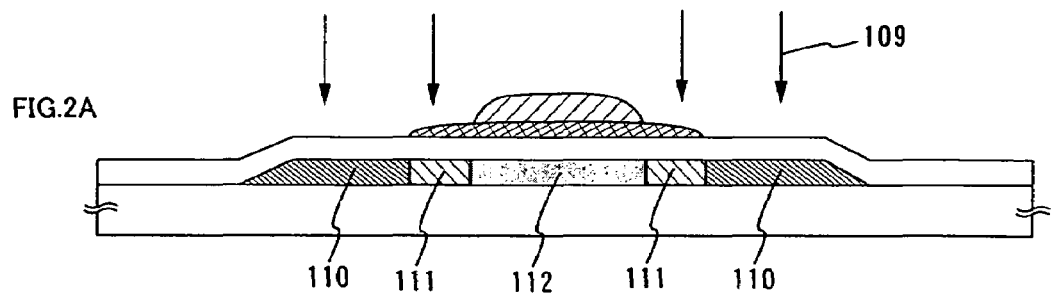
FIGS. 2A to 2D are explanatory cross-sectional views of a semiconductor device according to certain aspects of the present invention and a manufacturing method thereof.

Then, an impurity element 109 is introduced into the island-shaped semiconductor layer 103 by an ion implantation method or the like, using the first gate electrode layer 105 and the second gate electrode layer 106 as masks (FIG. 2A). Either an n-type impurity element or a p-type impurity element may be used for the impurity element 109. For example, phosphorus (P), arsenic (As), and antimony (Sb) can be used as the n-type impurity element, and boron (B) as the p-type impurity element.

A pair of impurity regions 110 is formed in part of the island-shaped semiconductor layer 103 where the first gate electrode layer 105 and the second gate electrode layer 106 are not overlapped with each other by introducing the impurity element 109. On the other hand, a pair of low-concentration impurity regions 111 is formed in part of the island-shaped semiconductor layer 103 only overlapped with the first gate electrode layer 105 by introducing the impurity element 109 through the first gate electrode layer 105. The pair of impurity regions 110 is to be a source or drain region. In addition, a channel region 112 is to be formed between the pair of low-concentration impurity regions 111 (FIG. 2A).

Here, a low-concentration impurity region is a comparatively low-concentration impurity region formed at the ends of a source or drain region to relieve an electric field concentrated at the end of a source or drain region in a transistor and to suppress a so-called hot carrier (a hot electron or a hot hole) effect. Impurities to be injected into the source or drain region (high-concentration impurity region) and the low-concentration impurity region may be the same or different. An LDD (Lightly Doped Drain) region is given as a typical example of a low-concentration impurity region. There is a transistor having a so-called double diffused drain (DDD) structure including a comparatively shallow high-concentration region and a low-concentration region surrounding it to relieve an electric field in vicinity of a drain. The above low-concentration impurity region also includes the low-concentration region in the DDD.

Figure 2B:
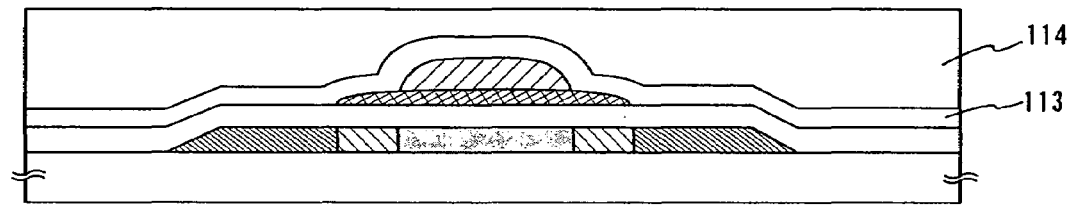

Next, a cap insulating film 113 to protect a TFT is formed over the second gate electrode layer 106 (FIG. 2B). The same material as that of the gate insulating film 104 can be used; however, it is desirable to use a silicon nitride film or a silicon oxynitride film to prevent impurities such as O, C, or Na from mixing. The cap insulating film 113 is not essential; however, it is as desirable to be formed as possible to protect a TFT from mixture of impurities.

Next, an interlayer insulating film 114 is formed over the second gate electrode layer 106 (when the cap insulating film 113 is formed, the interlayer insulating film 114 is formed over the cap insulating film 113) over the entire surface of a substrate (FIG. 2B). A heat-resistant organic resin, for example, a photosensitive or non-photosensitive organic material such as polyimide, acrylic, polyamide, resist, or benzocyclobutene; or siloxane (siloxane is composed of a skeleton formed by the bond of silicon and oxygen, in which an organic group at least containing hydrogen (such as an alkyl group or aromatic hydrocarbon), a fluoro group, or an organic group at least containing hydrogen and a fluoro group may be included as a substituent) can be used. In addition, carbon black (CB) may be mixed into a material thereof.

The following can be employed as a method for forming the interlayer insulating film 114 depending on the material: a spin coating method, a dipping method, a spray coating method, a droplet discharging method (an ink-jet method, a dispenser method, a screen printing method, an offset printing method, and the like), a doctor knife method, a roller coating method, a curtain coating machine, a knife coating method, or the like. Alternatively, an SOG film (for example, a SiOx film including an alkyl group) that can be obtained by a coating method can also be used. In addition, an inorganic material may be used, and in that case, silicon oxide, silicon nitride, silicon oxynitride, a film containing carbon such as DLC (diamond-like carbon) or carbon nitride (CN), PSG (phosphosilicate glass), BPSG (boron phosphosilicate glass), an alumina film, or the like can be used. A plasma CVD method, a low-pressure CVD (LPCVD) method, an atmospheric pressure plasma CVD method, or the like can be employed as the method for forming the interlayer insulating film 114. Note that the interlayer insulating film 114 may be formed by laminating these insulating films.

Figure 2C:
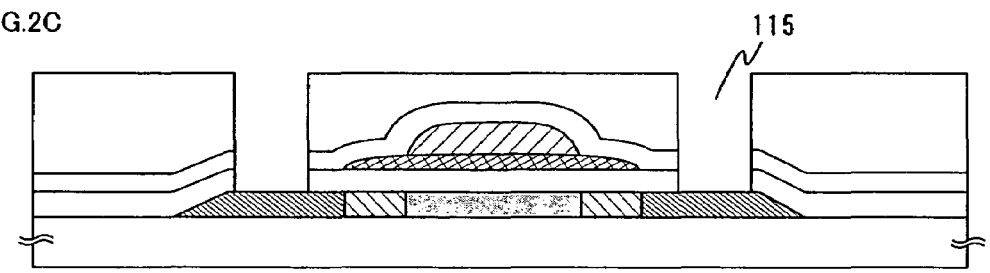

Next, a contact hole 115 is formed by etching the interlayer insulating film 114, the cap insulating film 113, and the gate insulating film 104, using a resist formed by patterning (FIG. 2C). Herein, plasma etching is employed and a chlorine-based gas typified by $Cl_2$, $BCl_3$, $SiCl_4$, or $CCl_4$; a fluorine-based gas typified by $CF_4$, $SF_6$, $NF_3$, $CHF_3$; or $O_2$ is used for the etching gas, which is not limited thereto. Note that the etching may utilize atmospheric pressure plasma.

Note that the interlayer insulating film 114 may be formed selectively by the droplet discharging method so that a region for forming a contact hole is left, without forming the interlayer insulating film 114 over the entire surface of the substrate. Accordingly, it is effective to form a liquid-repellent organic film such as FAS (fluoroalkyl silane) in advance in a region for forming a contact hole.

Figure 2D:
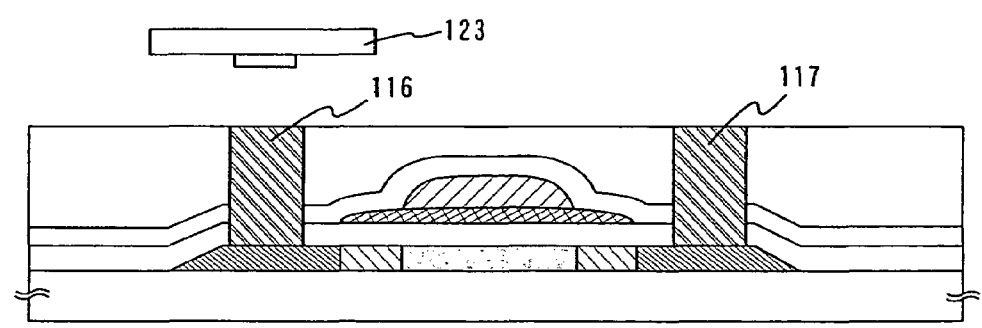

Next, a source electrode 116 and a drain electrode 117 are formed by discharging a third conductive material from a nozzle 123 by a droplet discharging method in the contact hole 115 (FIG. 2D). The same material as the first and second conductive materials can be selected for the third conductive material.

Through the steps mentioned above, a so-called top gate TFT of a LDD structure having low-concentration impurity region is completed.

As mentioned above, a semiconductor device according the invention comprises a semiconductor layer including a channel region, a pair of impurity regions, and a pair of low-concentration impurity regions; and a plurality of gate electrode layers different in width which are formed to be in contact with the semiconductor layer by sandwiching a gate insulating film therebetween, wherein the pair of low-concentration impurity regions is formed to overlap with part of the plurality of gate electrode layers where the film thickness is reduced.

In addition, a method for manufacturing a semiconductor device according to the invention comprises the steps of forming a gate insulating film over a semiconductor layer, forming a plurality of gate electrode layers different in width over the gate insulating film, and forming a pair of impurity regions and a pair of low-concentration impurity regions by introducing impurities into the semiconductor layer, using the plurality of gate electrode layers as masks, wherein the pair of low-concentration impurity regions is formed to overlap with part of the plurality of gate electrode layers where the film thickness is reduced.

According to the invention, a gate electrode layer is formed of at least two layers different in width (herein, the first and second gate electrode layers), and a pair of low-concentration impurity region is formed to overlap with a wider layer of the gate electrode layer formed of at least two layers. Accordingly, the gate electrode layer formed of at least two layers can be formed easily by particularly employing a droplet discharging method; thus, the convenience of the droplet discharging method can be taken with full advantage. In addition, a pair of impurity regions and a pair of low-concentration impurity regions can be easily formed by introducing an impurity element, using the gate electrode layer formed of at least two layers as a mask.

Note that a semiconductor device is described in this embodiment mode by giving a top gate TFT as an example; however, the application of the invention is not limited thereto. For example, the invention can also be applied to a dual gate TFT having a structure in which another gate electrode layer is provided in a lower part of a semiconductor layer by sandwiching a gate insulating film therebetween.

Embodiment Mode 2

Figure 3A:
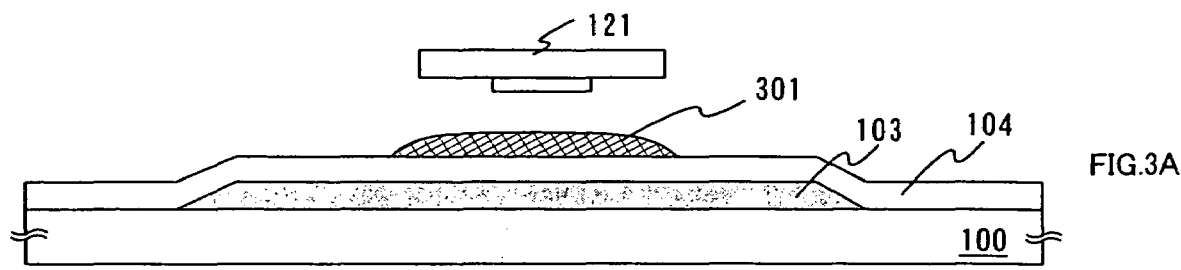
FIGS. 3A to 3D are explanatory cross-sectional views of a semiconductor device according to certain aspects of the present invention and a manufacturing method thereof.

This embodiment mode describes one embodiment mode of a structure of a semiconductor device according to the present invention and a manufacturing method thereof with reference to FIGS. 3A to 3D. Herein, a top gate TFT is given as an example to describe the embodiment mode. Steps of up to forming a gate insulating film 104 can be performed in the same manner as Embodiment Mode 1 (FIG. 3A).

A gate electrode layer 301 is formed by discharging a composition containing a conductive material from a nozzle 121 after forming the gate insulating film 104 (FIG. 3A). The conductive material can be selected from conductive materials shown in Embodiment Mode 1. In addition, the gate electrode layer 301 can be formed generally by performing heat treatment after discharging the composition. For example, the gate electrode layer 301 is formed by performing drying at 100° C. for 3 minutes and further performing baking at temperatures from 200° C. to 350° C. for 15 minutes to 30 minutes in an atmosphere containing nitrogen and/or oxygen.

Figure 3B:
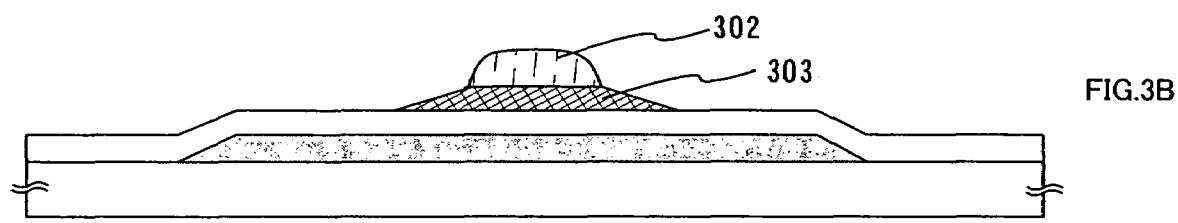

A resist 302 is selectively formed over a substantial center of the gate electrode layer 301 (FIG. 3B). It is desirable to form the resist 302 by a droplet discharging method. The place where the resist 302 is to be formed may be decided depending on the width of a low-concentration impurity region. Then, a gate electrode layer 303 having a taper-shaped side surface (hereinafter in this embodiment mode, simply referred to as a "gate electrode layer 303") is formed by etching the gate electrode layer 301, using the resist 302 as a mask (FIG. 3B).

Figure 3C:
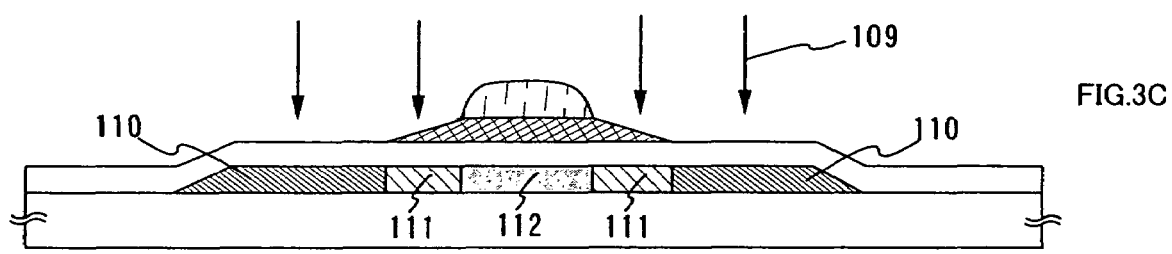

An impurity element 109 is introduced (doped) into an island-shaped semiconductor layer 103 by an ion implantation method or the like, using the gate electrode layer 303 and the resist 302 as masks (FIG. 3C). For example, phosphorus (P), arsenic (As), or antimony (Sb) can be used for the impurity element 109 in the case of an n-type impurity element, and boron (B) in the case of a p-type impurity element.

A pair of impurity regions 110 is formed in part of the island-shaped semiconductor layer 103 not overlapped with the gate electrode layer 303 by introducing the impurity element 109. On the other hand, a pair of low-concentration impurity regions 111 is formed in part of the island-shaped semiconductor layer 103 overlapped with the taper-shaped side surface of the gate electrode layer 303 by introducing the impurity element 109 through the side surface. The pair of impurity regions 110 is to be a source or drain region. In addition, a channel region 112 is to be formed between the pair of low-concentration impurity regions 111 (FIG. 3C).

Note that doping can also be performed after removing the resist 302. In that case, it is desirable to perform doping with the resist 302 left so that the impurity element is not introduced into the channel region 112.

Figure 3D:
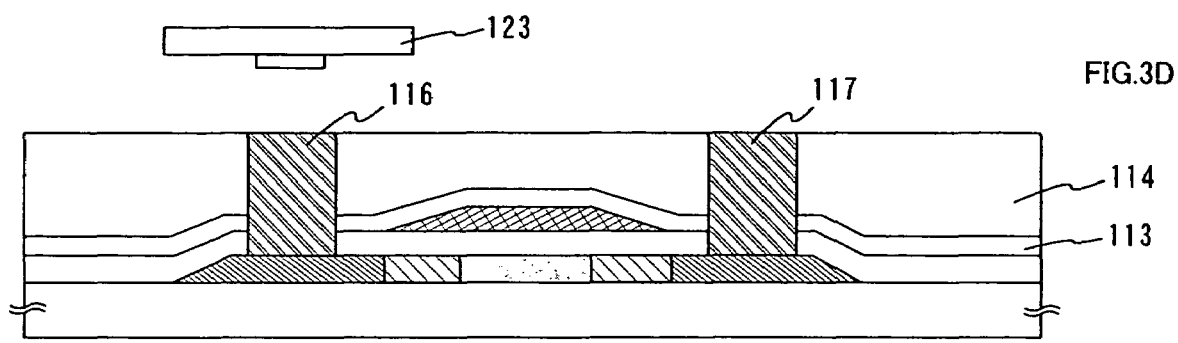

After removing the resist 302 or with the resist 302 left, a cap insulating film 113 and an interlayer insulating film 114 for protecting the TFT are formed over the gate electrode layer 303 in the same manner as Embodiment Mode 1 (FIG. 3D). Then, contact holes are formed by etching the interlayer insulating film 114, the cap insulating film 113, and the gate insulating film 104 and then a source electrode 116 and a drain electrode 117 are formed by discharging a conductive material in the contact holes from a nozzle 123 by a droplet discharging method (FIG. 3D). The same conductive material as that used for the gate electrode layer can be selected.

Through the steps mentioned above, a so-called top gate TFT of a LDD structure having low-concentration impurity region is completed.

As mentioned above, a semiconductor device according to the invention comprises a semiconductor layer including a channel region, a pair of impurity regions, and a pair of low-concentration impurity regions; and a taper-shaped gate electrode layer which is formed to be in contact with the semiconductor layer by sandwiching a gate insulating film therebetween, wherein the pair of low-concentration impurity regions is formed to overlap with a taper-shaped part of the gate electrode layer.

In addition, a method for manufacturing a semiconductor device according to the invention comprises the steps of forming a gate insulating film over a semiconductor layer, forming a gate electrode layer over the gate insulating film, performing etching by using an insulator formed over the gate electrode layer as a mask to make part of the gate electrode layer taper-shaped, and forming a pair of impurity regions and a pair of low-concentration impurity regions by introducing impurities into the semiconductor layer, using the taper-shaped gate electrode layer as a mask, wherein the pair of low-concentration impurity regions is formed to overlap with the taper-shaped part of the gate electrode layer.

According to the invention, a gate electrode layer has a taper-shaped side surface, and a pair of low-concentration impurity region is formed to overlap with the taper-shaped side surface of the gate electrode layer. Accordingly, the taper-shaped gate electrode layer can be formed easily by particularly employing a droplet discharging method; thus, the convenience of the droplet discharging method can be taken with full advantage. In addition, a pair of impurity regions and a pair of low-concentration impurity regions can be easily formed by introducing an impurity element, using the taper-shaped gate electrode layer as a mask.

Note that a semiconductor device is described in this embodiment mode by giving a top gate TFT as an example; however, the application of the invention is not limited thereto. For example, the invention can also be applied to a dual gate TFT. In order to obtain a taper shape, a gate electrode layer may be selectively formed by a droplet discharging method as mentioned above and then covered with an insulator such as a resist to perform etching into a taper shape on the both sides. Alternatively, the taper shape may be formed in a phased manner by discharging several times a composition containing a conductive material for forming the gate electrode layer from nozzles different in the discharge amount.

Embodiment Mode 3

This embodiment mode describes one embodiment mode of a structure of a semiconductor device according to the present invention and a manufacturing method thereof with reference to FIGS. 4A to 4E. Herein, a top gate TFT is given as an example to describe the embodiment mode. Steps of up to forming a composition that contains a conductive material for forming a gate electrode layer by a droplet discharging method, the steps can be performed in the same manner as Embodiment Mode 1 and Embodiment Mode 2.

Figure 4A:
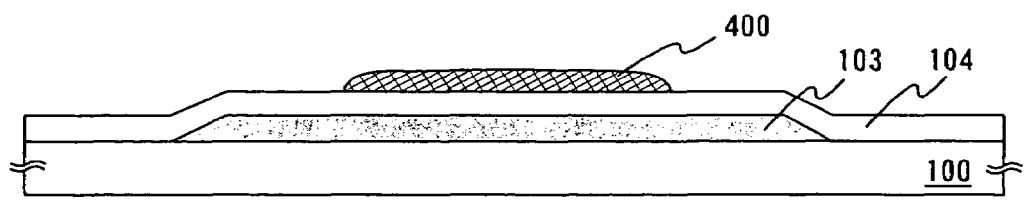
FIGS. 4A to 4E are explanatory cross-sectional views of a semiconductor device according to certain aspects of the present invention and a manufacturing method thereof.

After forming the composition containing a conductive material, drying treatment is performed and the composition is solidified to form a gate electrode layer 400 (FIG. 4A). The drying treatment is performed under a condition at 100° C. for 3 minutes, for example.

Figure 4B:
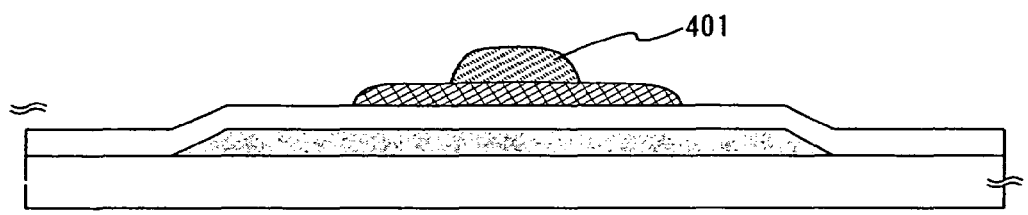

A heat-resistant insulator 401 (hereinafter in this embodiment mode, simply referred to as an "insulator 401") is selectively formed at a substantial center of the gate electrode layer 400 (FIG. 4B). It is desirable to form the insulator 401 by a droplet discharging method. The place where the insulator 401 is to be formed may be decided depending on the width of a low-concentration impurity region.

Typically, a heat-resistant resin such as siloxane can be used as a material of the heat-resistant insulator 401. However, the material of the insulator 401 is not limited thereto as long as it has heat resistance or heat absorbency.

Then, heat treatment is performed with the gate electrode layer 400 partially covered with the insulator 401. For example, baking is performed at temperatures from 200° C. to 350° C. for 15 minutes to 30 minutes in an atmosphere containing nitrogen and/or oxygen.

According to the above heat treatment, a film thickness is decreased in a region of the gate electrode layer 400 where the insulator 401 is not formed. The mechanism is as described in Embodiment Mode 1. When oxygen is not contained in a heating atmosphere or when a layer made of an organic component (organic layer) is left, the organic layer can be removed by oxygen plasma treatment or the like.

On the other hand, a film thickness is not decreased in a region of the gate electrode layer 400 covered with the insulator 401, because the region is protected by the insulator 401 during the heat treatment.

Figure 4C:
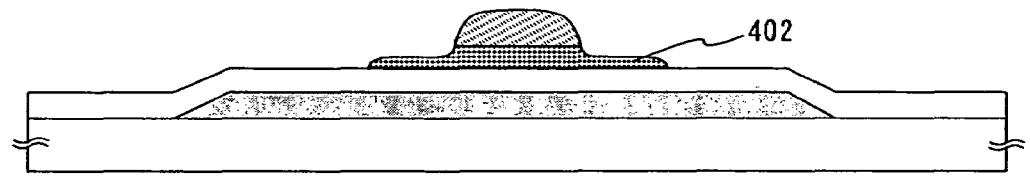

In this manner, heat treatment is applied to the gate electrode layer 400 partially covered with the insulator 401 to form a gate electrode layer 402 (hereinafter in this embodiment mode, simply referred to as a "gate electrode layer 402"). The film thickness of the gate electrode layer 402 is not even in the region that is covered with the insulator 401 and the region that is not covered therewith (FIG. 4C). Basically, the gate electrode layer 402 is formed of a single layer; however, the layer structure of the gate electrode layer 402 is not limited to the single layer structure in the case where the gate electrode layer 400 is formed of a multilayer.

Since the width of the entire gate electrode layer 402 is also decreased due to the above heat treatment, it is desirable to control the discharge condition of the gate electrode layer 400 before the heat treatment by considering the decrease.

In this manner, the gate electrode layer 400 is covered with the insulator 401 to bake in an atmosphere containing nitrogen and/or oxygen or to dry and thereafter the organic layer on the surface part is removed by treating with oxygen plasma. Therefore, the desired region of the gate electrode layer can be reduced in film thickness and width, and the remaining gate electrode layer can be smoothed, thinned, and reduced in electric resistance. The gate electrode can be reduced efficiently in film thickness and width particularly when the composition ratio of oxygen in the atmosphere is set to be from 10% to 25%; therefore, the gate electrode layer can be further smoothed, thinned, and reduced in electric resistance.

Figure 4D:
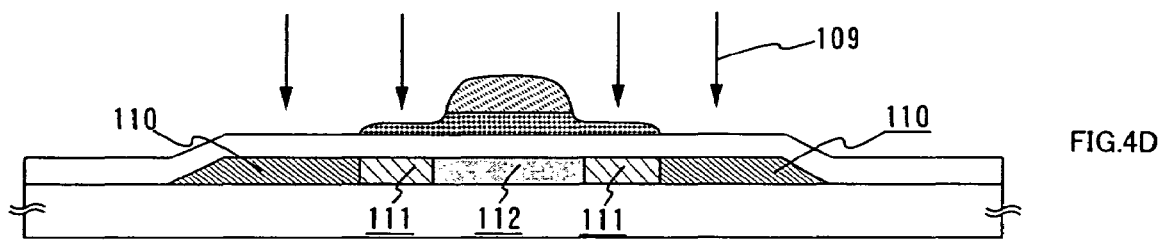

Then, an impurity element 109 is introduced (doped) into an island-shaped semiconductor layer 103 by an ion implantation method or the like, using the gate electrode layer 402 and the insulator 401 as masks (FIG. 4D). For example, phosphorus (P), arsenic (As), or antimony (Sb) can be used for the impurity element 109 in the case of an n-type impurity element, and boron (B) in the case of a p-type impurity element.

A pair of impurity regions 110 is formed in part of the island-shaped semiconductor layer 103 not overlapped with the gate electrode layer 402 by introducing the impurity element 109. On the other hand, a pair of low-concentration impurity regions 111 is formed in part of the island-shaped semiconductor layer 103 overlapped with a thinner part of the gate electrode layer 402 by introducing the impurity element 109 through the part. The pair of impurity regions 110 is to be a source or drain region. In addition, a channel region 112 is to be formed between the pair of low-concentration impurity regions 111 (FIG. 4D).

Note that doping can also be performed after removing the insulator 401. However, it is desirable to perform doping with the insulator 401 left so that the impurity element is not introduced into the channel region 112.

Figure 4E:
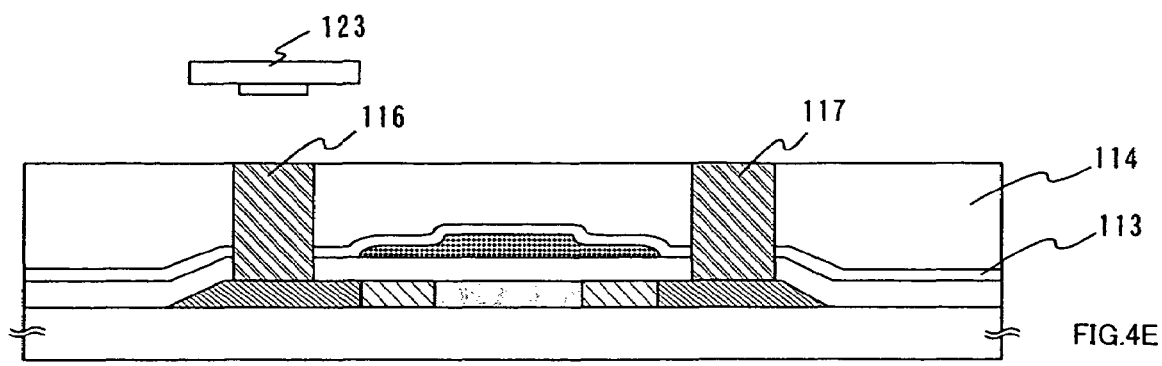

After removing the insulator 401 or with the insulator 401 left, a cap insulating film 113 and an interlayer insulating film 114 for protecting the TFT are formed over the gate electrode layer 402 in the same manner as Embodiment Mode 1 (FIG. 4E). Then, contact holes are formed by etching the interlayer insulating film 114, the cap insulating film 113, and a gate insulating film 104 and then a source electrode 116 and a drain electrode 117 are formed by discharging a conductive material in the contact holes from a nozzle 123 by a droplet discharging method (FIG. 4E). The same conductive material as that used for the gate electrode layer can be selected.

Through the steps mentioned above, a so-called top gate TFT of a LDD structure having low-concentration impurity region is completed.

As mentioned above, a semiconductor device according to the invention comprises a semiconductor layer including a channel region, a pair of impurity regions, and a pair of low-concentration impurity regions; and a gate electrode layer formed of a single layer, of which film thickness is not even, which is formed to be in contact with the semiconductor layer by sandwiching a gate insulating film therebetween, wherein the pair of low-concentration impurity regions is formed to overlap with a thinner part of the gate electrode layer.

As mentioned above, a method for manufacturing a semiconductor device according to the invention comprises the steps of forming a gate insulating film over a semiconductor layer, forming a gate electrode layer over the gate insulating film, forming a heat-resistant insulator over the gate electrode layer, forming a gate electrode layer of which film thickness is not even by reducing in film thickness part of the gate electrode where the insulator is not formed by heating the gate electrode layer in an atmosphere containing oxygen and nitrogen, and forming a pair of impurity regions and a pair of low-concentration impurity regions by introducing impurities into the semiconductor layer, using the gate electrode layer as a mask, wherein the pair of low-concentration impurity regions is formed to overlap with a thinner part of the gate electrode layer.

According to the invention, a gate electrode layer is formed of a single layer of which film thickness is not even, and a pair of low-concentration impurity region is formed to overlap with a thinner part of the gate electrode layer. Accordingly, the gate electrode layer can be formed easily by particularly employing a droplet discharging method; thus, the convenience of the droplet discharging method can be taken with full advantage. Particularly, a gate electrode layer formed of a single layer or a multilayer of which film thickness is not even can be formed by partially performing heat treatment to a composition containing a conductive material that is discharged by using a droplet discharging method. According to the invention, the gate electrode layer of which film thickness is not even is utilized to introduce an impurity element through a thinner part, which can form a pair of low-concentration impurity region easily.

Note that a semiconductor device is described in this embodiment mode by giving a top gate TFT as an example; however, the application of the invention is not limited thereto. For example, the invention can also be applied to a dual gate TFT.

Embodiment Mode 4

This embodiment mode describes one embodiment mode of a structure of a semiconductor device according to the present invention and a manufacturing method thereof with reference to FIGS. 5A to 5E. Herein, a top gate TFT is given as an example to describe the embodiment mode. Steps of up to forming a composition that contains a conductive material for forming a gate electrode layer by a droplet discharging method, the steps can be performed in the same manner as Embodiment Mode 1 and Embodiment Mode 2.

After forming the composition containing a conductive material, drying treatment is performed or the composition is left at room temperature and the composition is solidified to form a gate electrode layer 400 (FIG. 4A). In the case of the drying treatment, it is performed under a condition at 100° C. for 3 minutes, for example. Note that the gate electrode layer 400 may be either a single layer or a multilayer.

Figure 5A:
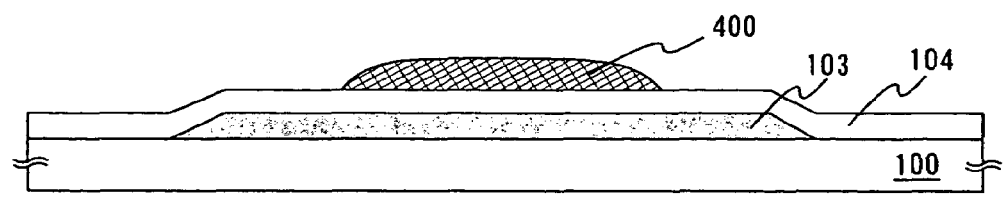
FIGS. 5A to 5E are explanatory cross-sectional views of a semiconductor device according to certain aspects of the present invention and a manufacturing method thereof.
Figure 5B:
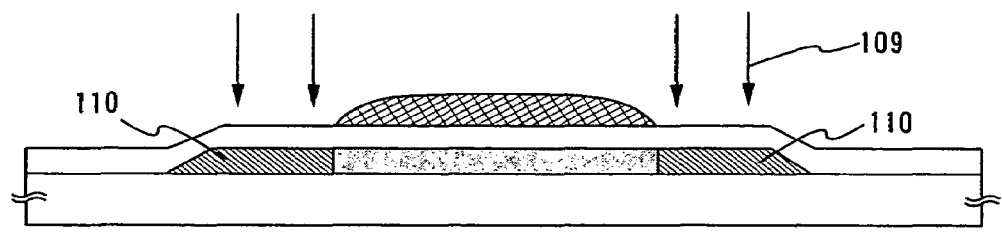

Then, an impurity element 109 is introduced (doped) into an island-shaped semiconductor layer 103 by an ion implantation method or the like, using the gate electrode layer 400 as a mask (FIG. 5B). For example, phosphorus (P), arsenic (As), and antimony (Sb) can be used in the case of an n-type impurity element, and boron (B) in the case of a p-type impurity element.

A pair of impurity regions 110 is formed in part of the island-shaped semiconductor layer 103 not overlapped with the gate electrode layer 400 by introducing the impurity element 109 (FIG. 5B). The pair of impurity regions 110 is to be a source or drain region.

Figure 5C:
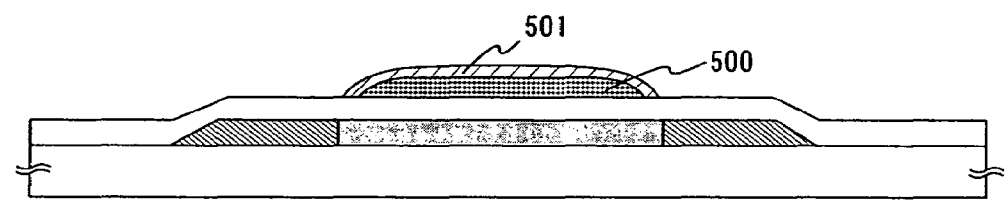

Then, heat treatment is performed on the gate electrode layer 400. For example, baking at temperatures from 200° C. to 350° C. for 15 minutes to 30 minutes in an atmosphere containing nitrogen and/or oxygen is performed as the heat treatment. According to this heat treatment, a gate electrode layer 500 which is the gate electrode layer 400 reduced in width and film thickness (hereinafter in this embodiment, simply referred to as a "gate electrode layer 500") is formed (FIG. 5C). The mechanism that the gate electrode layer 400 is reduced in width and film thickness is as described in Embodiment Mode 1. An organic layer 501 generated during the heat treatment is baked in an atmosphere containing nitrogen and/or oxygen or removed by performing oxygen plasma treatment or the like so that the gate electrode layer 500 can be obtained.

In this manner, the gate electrode layer 400 is baked in an atmosphere containing nitrogen and/or oxygen or dried and thereafter the organic layer on the surface part is removed by treating with oxygen plasma. Therefore, the desired region of the gate electrode layer can be reduced in film thickness and width, and the remaining gate electrode layer can be smoothed, thinned, and reduced in electric resistance. The gate electrode can be reduced efficiently in film thickness and width particularly when the composition ratio of oxygen in the atmosphere is set to be from 10% to 25%; therefore, the gate electrode layer can be further smoothed, thinned, and reduced in electric resistance.

For example, when the gate electrode is formed by discharging Ag paste and baking it at 230° C. for one hour in a nitrogen atmosphere, it has been proved from the experiment that a gate electrode layer formed in an approximately 1100 nm film thickness is decreased to have an approximately 700 nm film thickness by further baking the gate electrode at 230° C. for one hour in the nitrogen atmosphere mixed with oxygen of which composition ratio is 25%. The decrease rate is approximately 63%. There is no decrease rate in line width as in film thickness; however, the line width is decreased at the second baking. According to the second baking, the resistivity is decreased to from 60 $\mu\Omega\cdot cm$ to 70 $\mu\Omega\cdot cm$. Therefore, a low-concentration impurity region can be formed by doping impurities at high concentration after the first baking and by further doping impurities at low concentration with the utilization of the decrease of the gate electrode layer in line width and film thickness after the second baking. This result can also be applied to Embodiment Mode 3.

Figure 5D:
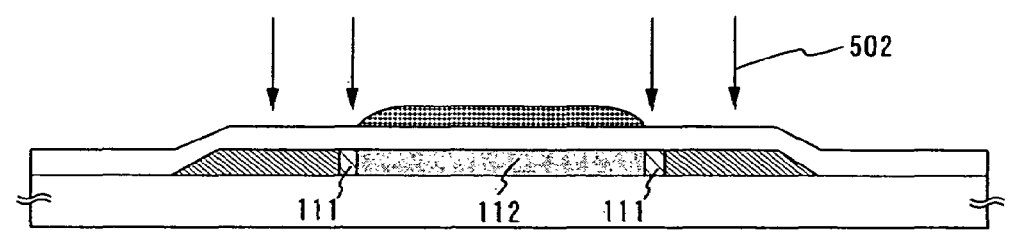

Then, a low-concentration impurity element 502 is introduced (doped) into the island-shaped semiconductor layer 103 by an ion implantation method or the like, using the gate electrode layer 500 as a mask (FIG. 5D). For example, phosphorus (P), arsenic (As), or antimony (Sb) can be used for the impurity element 502 in the case of an n-type impurity element, and boron (B) in the case of a p-type impurity element.

A pair of low-concentration impurity regions 111 is formed in part of the island-shaped semiconductor layer 103 not overlapped with the gate electrode layer 500 by introducing the low-concentration impurity element 502 (FIG. 5D). A channel region 112 is formed between the pair of low-concentration impurity regions 111.

Since the width of the low-concentration impurity regions 111 depends on the width of the gate electrode layer 400 decreased due to heat treatment, the above condition of the heat treatment may be appropriately adjusted in accordance with the desired width of the low-concentration impurity regions 111.

Figure 5E:
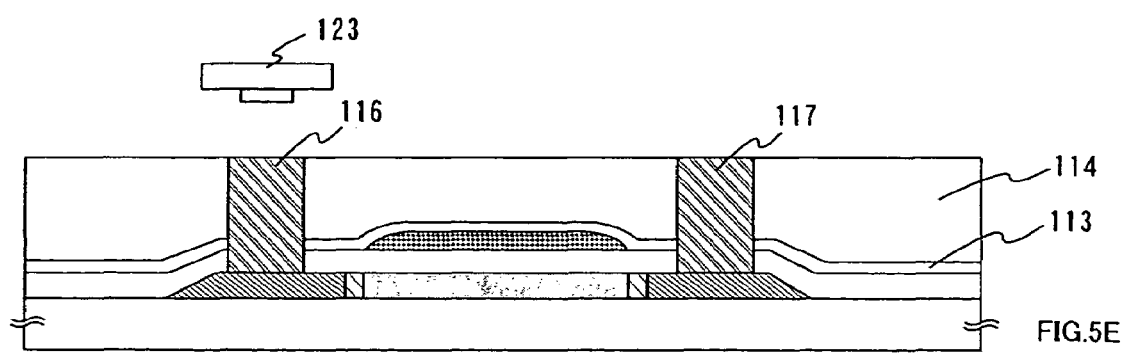

Then, a cap insulating film 113 and an interlayer insulating film 114 for protecting the TFT are formed over the gate electrode layer 500 in the same manner as Embodiment Mode 1 (FIG. 5E). Thereafter, contact holes are formed by etching the interlayer insulating film 114, the cap insulating film 113, and a gate insulating film 104 and then a source electrode 116 and a drain electrode 117 are formed by discharging a conductive material in the contact holes from a nozzle 123 by a droplet discharging method (FIG. 5E). The same conductive material as that used for the gate electrode layer can be selected.

Through the steps mentioned above, a so-called top gate TFT of a LDD structure having low-concentration impurity region is completed.

As mentioned above, a method for manufacturing a semiconductor device according to the invention comprises the steps of forming a gate insulating film over a semiconductor layer; forming a gate electrode layer over the gate insulating film; forming a pair of impurity regions by introducing impurities into the semiconductor layer, using the gate electrode layer as a mask; decreasing the gate electrode layer in film thickness and width by heating the gate electrode layer in an atmosphere containing oxygen and nitrogen; and forming a pair of low-concentration impurity regions by introducing impurities at low concentration into the semiconductor layer, using the gate electrode layer decreased in film thickness and width as a mask.

According to the invention, a gate electrode layer can be reduced in width and film thickness by performing heat treatment on a composition containing a conductive material for forming the gate electrode layer. This is utilized to introduce impurity elements at different concentration before and after the heat treatment by using the gate electrode layer as a mask. Therefore, a source and/or drain region, and a pair of low-concentration impurity regions can be formed in a semiconductor layer in simple steps. The gate electrode layer can be formed easily by particularly employing a droplet discharging method; thus, the convenience of the droplet discharging method can be taken with full advantage.

Note that a semiconductor device is described in this embodiment mode by giving a top gate TFT as an example; however, the application of the invention is not limited thereto. For example, the invention can also be applied to a dual gate TFT.

Embodiment 1

Figure 6A:
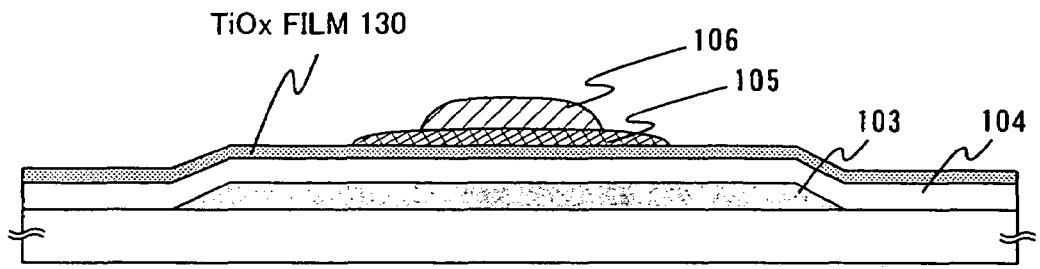
FIGS. 6A to 6C are explanatory cross-sectional views of pre-base treatment.
Figure 6B:
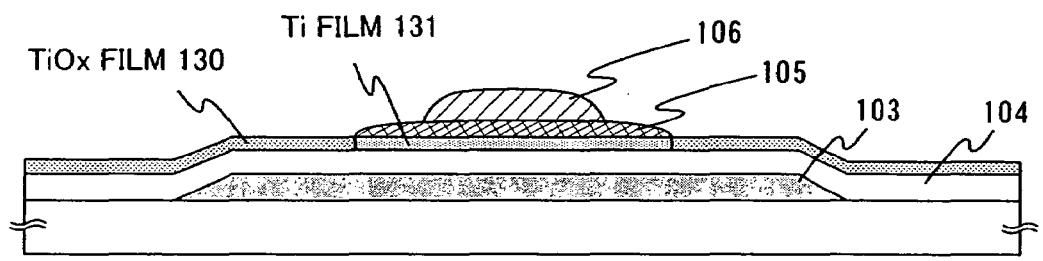
Figure 6C:
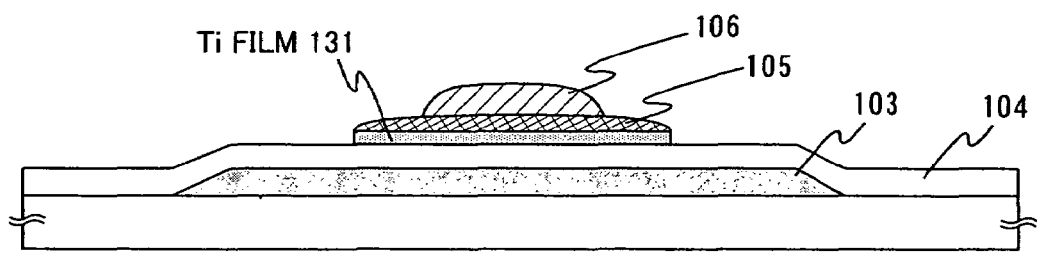

This embodiment describes the case of performing pre-base treatment, particularly, providing a hydrophilic film to be in contact with the bottom part of a gate electrode layer in a structure of a semiconductor device according to the present invention and a manufacturing method thereof with reference to FIGS. 6A to 6C. Herein, a top gate TFT is given as an example to describe the case. Steps of up to forming a gate insulating film 104 can be performed in the same manner as the above Embodiment Modes in FIGS. 6A to 6C.

FIG. 6A shows the case of forming an oxide film of a conductor (herein, a TiOx film 130) over an entire surface of a substrate or at least in a region where a gate electrode layer is formed. Typically, titanium dioxide also used as a photocatalytic is preferably used as the TiOx (titanium oxide) film. Thereafter, gate electrode layers 105 and 106 are formed as in Embodiment Mode 1, for example.

FIG. 6B shows the case of forming a conductive film (herein, a Ti film 131) over an entire surface, then for example, forming gate electrode layers 105 and 106 as in Embodiment Mode 1 and performing oxidation treatment (baking or baking after $O_2$ ion implantation) of the Ti film 131 by using these gate electrode layers as masks, thereby forming a TiOx film 130 in the periphery of the gate electrode layers. After forming a Ti film to be from 1 nm to 5 nm, for example, the oxidation treatment is performed by baking the Ti film at 230° C. The short circuit between the gate electrode layers can be prevented by performing the oxidation treatment.

FIG. 6C shows the case of forming a Ti film 131 over an entire surface, then for example, forming gate electrode layers 105 and 106 as in Embodiment Mode 1 and etching the exposed portion of the Ti film 131 by using the gate electrode layer 105 as a mask. Accordingly, the short circuit between the gate electrode layers can be prevented.

In addition, the following can also be used besides Ti: a so-called 3d transition element such as Sc (scandium), V (vanadium), Cr (chromium), Mn (manganese), Fe (iron), Co (cobalt), Ni (nickel), Cu (copper), or Zn (zinc); W (tungsten), Al (aluminum), Ta (tantalum), Zr (zirconium), Hf (hafnium), Ir (iridium), Nb (niobium), Pd (palladium), or Pt (platinum); oxide, nitride, or oxynitride thereof. When these metal is directly formed on an entire surface of a substrate, part of the Ti film where the gate electrode layers are not formed needs to be removed or insulated by oxidizing, nitriding, or nitride oxidizing as in FIGS. 6B and 6C.

Note that the titanium oxide is also known as a photocatalytic substance; however, a photocatalytic substance such as strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), ferric oxide ($Fe_2O_3$), or tungsten oxide ($WO_3$) may be formed as well. In addition, polyimide, acrylic, or a heat-resistant resin such as siloxane may be formed instead of such materials containing the metals as a main component, or plasma treatment (preferably, atmospheric-pressure plasma) may be performed.

There is particularly no limitation on a method for manufacturing the above conductive film, and oxide, nitride, and nitride oxide thereof. The conductive film; and oxide, nitride, and nitride oxide thereof may be entirely or selectively formed directly on a substrate by a droplet discharging method or a spray method. The adhesion between the gate insulating film 104 and a gate electrode layer to be subsequently formed can also be enhanced by forming a hydrophilic film such as the TiOx film 130 or the Ti film 131. Note that this embodiment can be arbitrarily combined with other embodiment modes or embodiment.

Embodiment 2

This embodiment describes the case of using SAS (semi-amorphous silicon) as a semiconductor layer 101 (or an island-shaped semiconductor layer 103) in a structure of a semiconductor device according to the present invention and a manufacturing method thereof.

SAS can be obtained by performing glow discharge decomposition on a silicide gas. A typical silicide gas is $SiH_4$, and besides, $Si_2H_6$, $SiH_2Cl_2$, $SiHCl_3$, $SiCl_4$, $SiF_4$, or the like can be used. The SAS can be easily formed by using this silicide gas by diluting with hydrogen or hydrogen and one or more kinds of a rare gas element of helium, argon, krypton, and neon. It is preferable to dilute the silicide gas with a dilution rate ranging from 10 times to 1000 times. Of course, reaction of film to be formed by grow discharge decomposition is generated in a low pressure, and the pressure may be in the range of approximately from 0.1 Pa to 133 Pa. High-frequency power ranging from 1 MHz to 120 MHz, preferably from 13 MHz to 60 MHz may be supplied as a power for forming glow discharge. Temperatures 300° C. or less are preferable as a heating temperature of a substrate and temperatures from 100° C. to 200° C. are recommended.

In addition, an energy bandwidth may be adjusted to range from 1.5 eV to 2.4 eV or from 0.9 eV to 1.1 eV by mixing gaseous carbide such as $CH_4$ or $C_2H_6$, or a germanium gas such as $GeH_4$ or $GeF_4$ into a silicide gas.

In addition, the SAS shows low electrical conductivity of n-type when an impurity element to control a valance electron is not added intentionally. This is because oxygen is likely to be contained in a semiconductor film since glow discharge of higher power is carried out than when an amorphous semiconductor is formed. Thus, it is possible to control a threshold value by adding an impurity element imparting p-type conductivity to the first semiconductor film which provides a channel formation region of a TFT at the same time as this deposition or after the deposition. An impurity element imparting p-type conductivity is typically boron and an impurity gas such as $B_2H_6$ or $BF_3$ ranging from 1 ppm to 1000 ppm in its rate may be contained in a silicide gas. For example, when boron is used as an impurity element imparting p-type conductivity, the concentration of boron may range from $1 \times 10^{14}$ to $6 \times 10^{16}$ atoms/$cm^3$. Electric field effect mobility ranging from 1 $cm^2$/V·sec to 10 $cm^2$/V·sec can be obtained by forming a channel formation region with the above SAS. Note that this embodiment can be arbitrarily combined with other embodiment modes or embodiment.

EMBODIMENT 3

This embodiment describes a method for manufacturing an active matrix EL light-emitting device according to the present invention mainly with reference to FIGS. 7A and 7B, FIGS. 8A and 8B, FIGS. 9A to 9C, and FIGS. 10A to 10C.

Figure 7A:
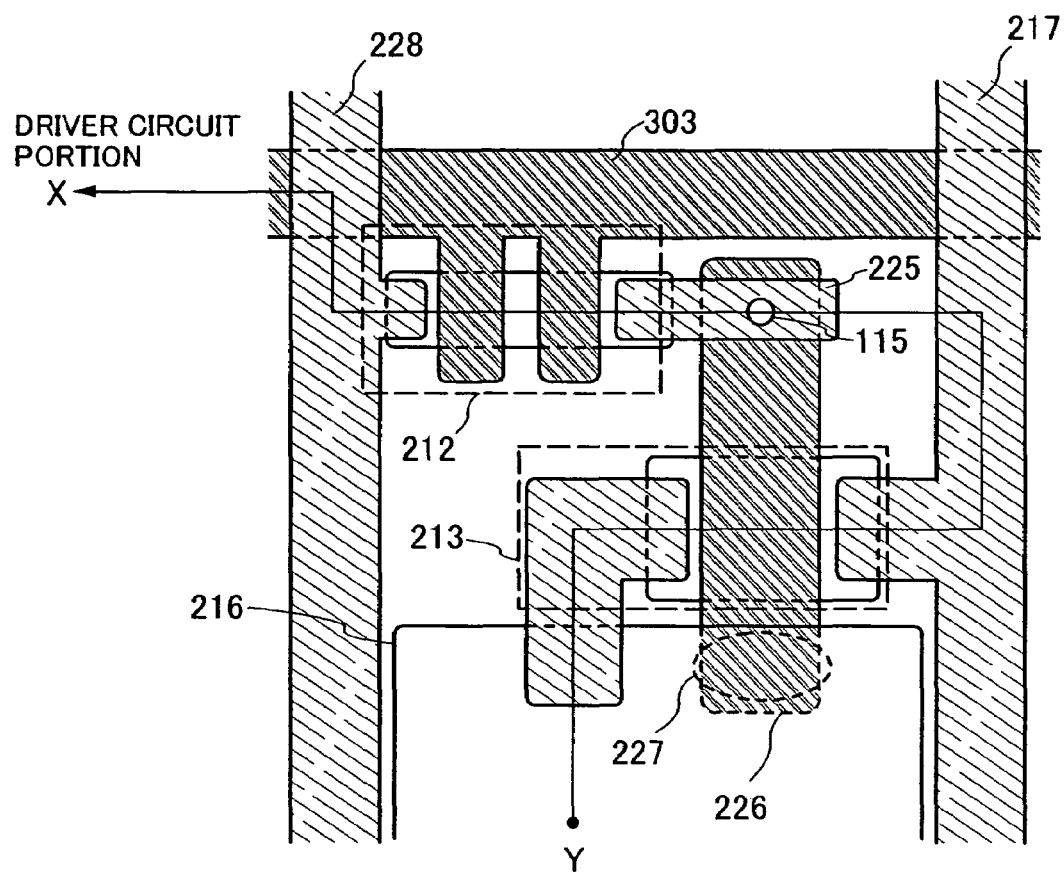
FIGS. 7A and 7B are a top view of a pixel of a light-emitting device according to certain aspects of the present invention and a circuit diagram thereof.

In the EL light-emitting device, the fluctuation of ON current in a switching TFT provided for a pixel region can be suppressed in the case of driving a light-emitting element formed of a layer containing an organic compound or an inorganic compound (typically, a light-emitting element utilizing electroluminescence (EL)) with a thin film transistor (TFT). Therefore, the EL light-emitting device has at least a two-transistor structure provided with a driving TFT as shown in FIGS. 7A and 7B, in general.

Herein, the above light-emitting element is an element that utilizes a phenomenon of emitting light in the following case. Layers containing an organic compound or an inorganic compound different in carrier transportability are laminated between a pair of electrodes. Accordingly, a hole can be injected from one electrode and an electron can be injected from the other electrode, and the hole injected from one electrode and the electron injected from the other electrode are recombined to excite a luminescence center, which returns to a ground state.

Figure 7B:
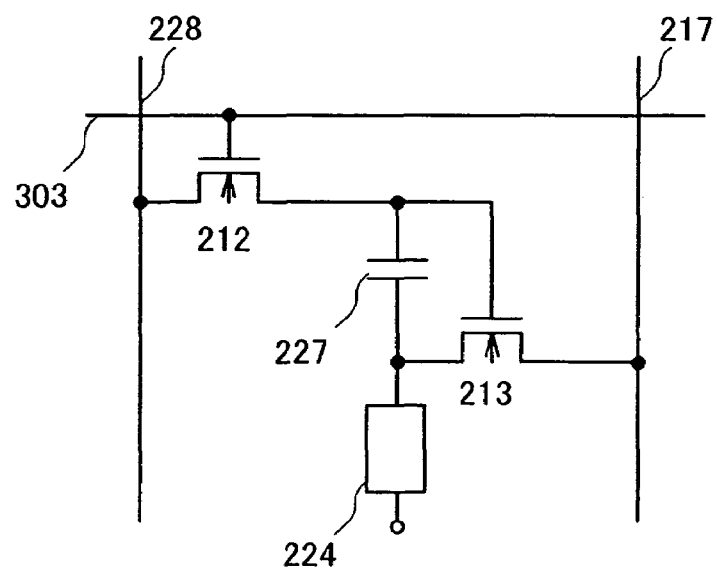
Figure 8A:
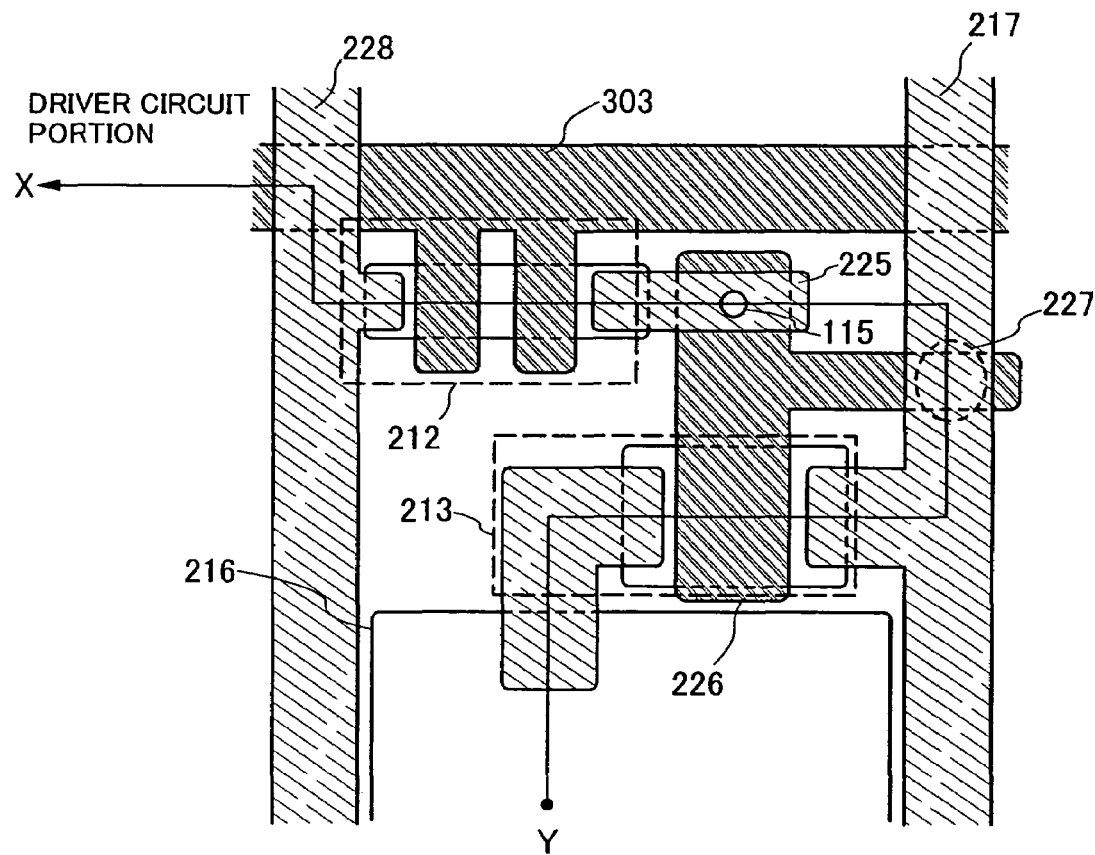
FIGS. 8A and 8B are a top view of a pixel of a light-emitting device according to certain aspects of the present invention and a circuit diagram thereof.
Figure 8B:
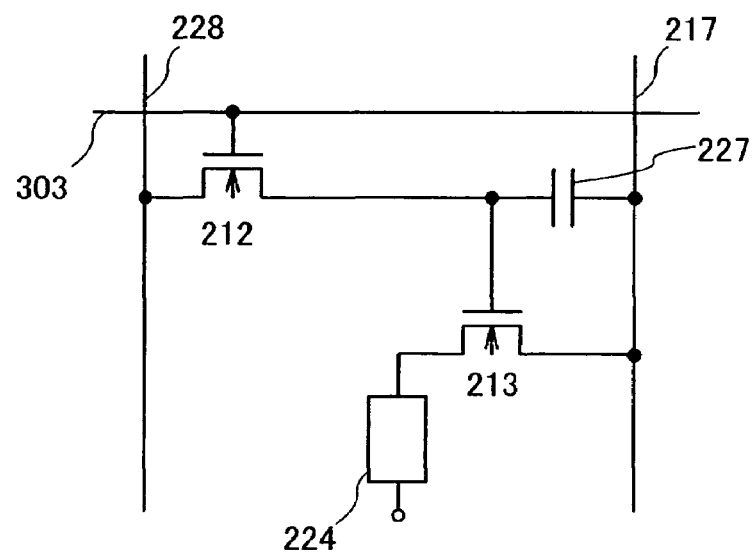

Note that FIG. 7B shows a circuit diagram in the case of a sequentially laminated light-emitting element. The sequentially laminated light-emitting element here refers to the case in which a pixel electrode of a driving TFT 213 serves as a hole injection electrode (anode). Note that FIG. 8B shows a circuit diagram in the case of a reversely laminated light-emitting element. The reversely laminated light-emitting element here refers to the case in which a pixel electrode of a driving TFT 213 serves as an electron injection electrode (cathode).

In addition, reference numeral 212 in FIG. 7B denotes a switching TFT, which controls ON/OFF of a current flowing to a pixel. Herein, as can be seen from FIG. 7A, a drain wiring 225 (or a source wiring) of the switching TFT 212 is connected to a gate electrode layer 226 of a driving TFT 213 in its structure, and the gate electrode layer 226 and the drain wiring 225 are electrically connected to each other through a contact hole 115 because there is a gate insulating film therebetween. Note that the reference numerals mentioned above are similarly used in FIGS. 8A and 8B. In addition, reference numeral 227 each denotes a capacitor portion in FIGS. 7A and 7B and FIGS. 8A and 8B; however, a region where a capacitor portion is to be formed is not limited to this region. Note that reference numerals in FIGS. 7A and 7B and FIGS. 8A and 8B correspond to FIGS. 9A to 9C and FIGS. 10A to 10C.

A light-emitting device according to the invention and a manufacturing method thereof are described with reference to FIGS. 9A to 9C and FIGS. 10A to 10C. FIGS. 9A to 9C show a cross-sectional structure taken along line X-Y in FIG. 7A or FIG. 8A. Note that the capacitor portion 227 is omitted in FIGS. 9A to 9C and FIGS. 10A to 10C. This embodiment describes an active matrix EL light-emitting device using the TFT having the taper-shaped gate electrode layer in Embodiment Mode 2. However, the structure of the gate electrode layer is not limited thereto and other embodiment modes or embodiments can be substituted or combined.

First, a base insulating film 118 is formed over a substrate 100. Herein, a laminated structure of SiNO and SiON is employed (FIG. 9A); however, the material and structure are not limited thereto. The material can be selected from the same materials as those of the gate insulating film mentioned above.

Then, an island-shaped semiconductor layer 103 and a gate insulating film 104 are formed over the base insulating film 118 in the manner shown in the above embodiment modes or embodiments (FIG. 9A).

Furthermore, etching is performed using a resist 302 in the manner shown in Embodiment Mode 2 to form a taper-shaped gate electrode layer 303 (FIG. 9A). Herein, since a gate electrode layer 226 of a driving TFT 213 in a pixel portion 215 is connected to a switching TFT 212, the gate electrode layer 226 is extended in the direction of the switching TFT 212 (see FIG. 7A or FIG. 8A). Therefore, the gate electrode layer denoted by reference numeral 226 in FIG. 9A is formed of a single layer in general. Note that it is enough for the gate electrode layer 226 to have a taper shape at least only in a region where an impurity element is introduced. In addition, the above gate electrode layer may have a laminated structure.

Then, a resist 200 is formed above part where a p-channel TFT 211 in a driver circuit portion 214 is formed (the resist 200 is desirable to be formed by a droplet discharging method). Thereafter, an n-type impurity element 201 in the order of from $10^{15}$ atoms/cm$^3$ to $10^{17}$ atoms/cm$^3$ is doped into the island-shaped semiconductor layer 103 by using the gate electrode layer 303 and a gate electrode layer 225 as masks. Accordingly, an n-type impurity region 202 to be a source or drain region is formed in each island-shaped semiconductor layer that is not covered with a gate electrode layer of an n-channel TFT 210 in the driver circuit portion 214, and the switching TFT 212 and the driving TFT 213 in the pixel portion 215. Further, an n-type low-concentration impurity region 203 is formed in each region overlapped with a taper-shaped part of the gate electrode layer. Furthermore, a channel region 204 is each formed therebetween (FIG. 9B). In particular, the driving TFT 213 in the pixel portion 215 is preferably selected from either an n-channel TFT or a p-channel TFT depending on a laminated structure of a light-emitting element 224 to be subsequently formed.

Here, arsenic (As), phosphorus (P), or the like can be used as the n-type impurity element. Thereafter, the resist 200 is removed by O$_2$ ashing or the like. In this case, the resist 302 is also removed simultaneously when the resist 302 remains over the gate electrode layer.

Then, the regions to be the n-channel TFT 210 in the driver circuit portion 214, and the switching TFT 212 and the driving TFT 213 in the pixel portion 215 are covered with a resist 205 (it is desirable to form the resist 205 by a droplet discharging method). Thereafter, a p-type impurity element 206 in the order of from $10^{15}$ atoms/cm$^3$ to $10^{17}$ atoms/cm$^3$ is doped into the island-shaped semiconductor layer of the p-channel TFT 211 by using the gate electrode layer 303 as a mask. Accordingly, a p-type impurity region 207 to be a source or drain region of the p-channel TFT 211 is formed. Further, a p-type low-concentration impurity region 208 is formed in a region overlapped with a taper-shaped part of the gate electrode layer. Furthermore, a channel region 209 is formed therebetween (FIG. 9C). Herein, boron (B) or the like can be used as the p-type impurity element. Thereafter, the resist 205 is removed by O$_2$ ashing or the like. In this case, the resist 302 is also removed simultaneously when the resist 302 remains over the gate electrode layer of the p-channel TFT 211.

Note that the impurity element may be activated by heat treatment after performing the above doping.

Then, a cap insulating film 113 covering the TFTs is formed by a plasma CVD method (FIG. 10A). A silicon nitride film or a silicon oxynitride film is preferably used as the cap insulating film 113; however, the material is not limited thereto. In addition, the forming method is also not limited thereto. Note that it is desirable to form the cap insulating film 113 as much as possible in order to prevent mixture of impurities from above the TFTs.

In addition, it is desirable to form a passivation film for preventing diffusion of impurities from above the TFTs over a source and/or drain wiring, though not shown in a figure. The passivation film can be formed by a method for forming a thin film such as a plasma CVD method or a sputtering method, using silicon nitride, silicon oxide, silicon nitride oxide, silicon oxynitride, aluminum oxynitride, aluminum oxide, diamond like carbon (DLC), carbon nitride (CN), or other insulating materials. Further, these materials may be laminated. Note that the passivation film can also be formed discharging a composition containing fine particles of an insulating material by a droplet discharging method.

Then, heat treatment for activating the impurity element added into the semiconductor layer is performed. This activation is performed by heating an atmosphere containing $N_2$ in a furnace at temperatures from 500° C. to 800° C. For example, an RTA (rapid thermal annealing) method can be employed. Alternatively, activation may be performed irradiating the semiconductor layer with laser light. In this case, laser light irradiation may be performed only from a backside or a surface side of the substrate or may be performed from both a backside and a surface side of the substrate. Note that the activation treatment may be skipped in the case of simplifying the steps.

Thereafter, a dangling bond of silicon may be terminated forming an insulating film including a silicon nitride film or a silicon nitride oxide film containing hydrogen by a plasma CVD method, discharging hydrogen from the insulating film, and performing heat treatment for hydrogenating the semiconductor layer. This heat treatment may be performed using a clean oven at temperatures from 350° C. to 450° C. (preferably, at 410° C.) in an atmosphere containing $N_2$. Note that another insulating film containing hydrogen and silicon may be used as the insulating film, and a method as well as the plasma CVD method may also be employed as the method for forming the insulating film.

Then, an interlayer insulating film 114 is formed over the cap insulating film 113. Herein, the entire surface of the substrate is coated with a solution containing polyimide by a spin coating method; however, the material and method are not limited thereto. For example, an acrylic-based resin; a polyamide-based resin; an inorganic siloxane-based insulating film, among compounds formed of silicon, oxygen, and hydrogen, including the Si—O—Si bond; an organic siloxane-based insulating film, among the compounds, in which hydrogen bonded with silicon is substituted by an organic group such as methyl or phenyl; or the like can be used besides the polyimide-based resin. In addition, the interlayer insulating film 114 can also be formed by a droplet discharging method.

Contact holes are formed by selectively removing the interlayer insulating film 114, the cap insulating film 113, and the gate insulating film 104. When an insulating film is formed for hydrogen treatment, the insulating film is also removed. The conventional method in which prebaking is performed after coating a resist over an entire surface of a substrate, a mask pattern is formed after light exposure and development process, and the contact hole is formed etching the mask pattern can be employed to form the contact holes. However, a method for forming a mask pattern by selectively discharging a resist by a droplet discharging method is desirable from viewpoint of reducing the cost and simplifying the step.

A pixel electrode 216 is formed after forming the contact holes (FIG. 10B). The pixel electrode 216 may be formed by a droplet discharging method or may be formed through a patterning step. Note that the pixel electrode 216 may be formed before forming the contact holes.

Then, wirings 217 and 228, and the like connected to the source and/or drain region of each TFT are formed through the contact holes (FIG. 10B). Here, the wiring 217 is a wiring that connects the source or drain region of the switching TFT 212 to the gate electrode layer of the driving TFT 213. On the other hand, the wiring 228 is a wiring that connects the source or drain region of the driving TFT 213 to the pixel electrode 216. These wiring are desirable to be formed discharging a composition containing a conductive material. A metal such as Ag, Au, Cu, Ni, Pt, Pd, Ir, Rh, W, Al, Ta, Mo, Cd, Zn, Fe, Ti, Si, Ge, Zr, or Ba; an Al—C—Ni alloy; fine particles or the like of silver halide; dispersible nanoparticles; or the like can be used as the conductive material.

Note that these wiring can be formed to have a multilayer structure. For example, the wirings are formed laminating a Ti film having a film thickness of from 50 nm to 20 nm, an Al film or Al—Si alloy film having a film thickness of from 250 nm to 400 mm, and a Ti film having a film thickness of from 50 nm to 200 nm. In the case of a triple layer structure, TiN or titanium nitride including nitrogen of 50% or less in composition ratio (titanium nitride including nitrogen of 50% or less in composition ratio is referred to as Ti (N) in this specification) may be substituted for Ti, or a structure in which TiN or Ti (N) is newly laminated may be employed. In addition, since a hillock of Al is generated at temperatures from 150° C. to 200° C., it is desirable for the Al film to contain Si. In the case of particularly using Al in this manner, there is a problem of corrosion when the Al is in direct contact with ITO. However, this problem can be solved sandwiching Ti (or TiN) between the Al and the ITO. In the case of particularly using an Al—C—Ni alloy, there is advantage that the Al—C—Ni alloy can be in direct contact with ITO without sandwiching Ti or the like therebetween.

Through the steps mentioned above, an active matrix substrate comprising the driver circuit portion 214 including a CMOS structure, having the n-channel TFT 210 and the p-channel TFT 211, and the pixel portion 215 having the switching TFT 212, the driving TFT 213, and the capacitor portion is completed (FIG. 10C). Note that a semiconductor device according to the invention is used for the driver circuit portion and the pixel portion in this embodiment; however, the semiconductor device can be used for at least one of them.

Furthermore, a partition (also referred to as an embankment, a bank, or the like) 218 formed using an organic resin film or an inorganic insulating film is selectively formed over the pixel electrode 216 by a droplet discharging method. A heat-resistant resin such as siloxane or a resin such as polyimide or acrylic is desirable to be used for the partition 218. Particularly, a subsequent vacuum baking step can be performed at high temperature by using siloxane; thus, moisture that causes a negative effect on an EL element can be removed sufficiently. Note that the partition 218 has an opening portion by being selectively formed and the pixel electrode 216 is exposed in the opening portion. Note that the partition 218 may also be formed patterning using a resist or the like.

Then, a layer containing an organic compound 219 (an electroluminescent layer) is formed to be in contact with the pixel electrode 216 in the opening of the partition 218. The layer containing an organic compound 219 may be formed of a single layer or may be formed laminating a plurality of layers. In the case of a plurality of layers, an element structure sequentially laminated in the following order viewed from the semiconductor element side (pixel electrode side) is preferably employed: an anode, a hole injection layer, a hole transport layer, a light-emitting layer, an electron transport layer, and a cathode; an anode, a hole injection layer, a light-emitting layer, an electron transport layer, and a cathode; an anode, a hole injection layer, a hole transport layer, a light-emitting layer, an electron transport layer, an electron injection layer, and a cathode; an anode, a hole injection, a hole transport layer, a light-emitting layer, a hole blocking layer, an electron transport layer, and a cathode; and an anode, a hole injection layer, a hole transport layer, a light-emitting layer, a hole blocking layer, an electron transport layer, an electron injection layer, and a cathode; and the like. This is a so-called sequential lamination structure, in which the pixel electrode 216 functions as an anode (hole injection electrode). On the other hand, the case of laminating the cathode first viewed from the semiconductor element side (pixel electrode side) is a reverse lamination structure, in which the pixel electrode 216 functions as a cathode.

An opposite electrode 220 is formed to cover the layer containing an organic compound 219. The opposite electrode 220 functions as an anode or a cathode depending on a method for laminating a light-emitting layer. A light-emitting element 224 is formed sandwiching the layer containing an organic compound 219 between the pixel electrode 216 and the opposite electrode 220.

Then, a passivation film 221 is formed in order to protect the layer containing an organic compound 219 (particularly, a light-emitting layer) from moisture. Instead, it is preferable to perform packaging (sealing) using a protective film (a laminated film, an ultraviolet curable resin film, and the like) or a cover member with little degasification and high airtightness in stead of the passivation film 221 or further prevent the passivation film 221 from being exposed to outside air. In this specification, the laminated film is defined as a laminated film of a base material film and an adhesive synthetic resin film or laminated film of two or more films. Polyester such as PET or PBT, polyamide such as nylon 6 or nylon 66, an inorganic vapor-deposition film, or paper is preferably used as the base material film. In addition, polyolefin such as PE or PP, an acrylic-based synthetic resin, an epoxy-based synthetic resin, or the like may be used as the adhesive synthetic resin film. The laminated film is laminated with a subject due to thermocompression bonding by using a laminate device. Note that an anchor coating agent is preferably coated as pretreatment of a laminating step; thus, the laminated film and the subject can be adhered firmly to each other. An isocyanate-based material or the like is preferably used as the anchor coating agent. Lastly, the active matrix substrate is sealed with a sealing substrate 223 by sandwiching an insulator 222 therebetween.

Through the steps mentioned above, the EL light-emitting device is completed (FIG. 10C). The EL light-emitting device is classified broadly into a bottom emission type, a top emission type, and a dual emission type depending on the direction of light emission. Hereinafter, a structure of a light-emitting element also including the pixel electrode 216 and the opposite electrode 220 in each type is described.

In the case of the bottom emission type, transmitting metal, for example, a transparent conductive film such as ITO, ITSO, ZnO, IZO, or GZO can be used as a material of the pixel electrode 216 (in this case, a hole injection electrode). Particularly in the case of using ITSO, hole injection efficiency to a light-emitting layer can be enhanced while maintaining low electric resistance between the TFT and the pixel electrode 216, which are connected, by laminating ITSO containing silicon oxide at different concentration. On the other hand, Ca, Al, CaF, MgAg, AlLi, or the like which is low in work function can be used as a material of the opposite electrode 220 to be a cathode (electron injection electrode).

In the case of the top emission type, generally, a top emission light-emitting device capable of extracting light from a light-emitting element to an opposite side (upper-side) of a substrate can be obtained by replacing the hole injection electrode (the pixel electrode 216) and the electron injection electrode (the opposite electrode 220) with each other in the bottom emission type, further by reversely laminating the layer containing an organic compound, and by reversing polarities of a current control TFT. For example, reflective metal, for example, Al, AlLi, or the like can be used as the pixel electrode 216, and a transparent conductive film such as light-transmitting ITO, ITSO, ZnO, IZO, or GZO can be used as the opposite electrode.

In the case of the dual emission type, a transparent conductive film such as ITO, ITSO, ZnO, IZO, or GZO can also be used as a material of a hole injection electrode (the pixel electrode 216) as in the case of the bottom emission type. Such a thin aluminum film having a film thickness of from 1 nm to 10 nm, an aluminum film containing minute amount of Li, or the like that transmits light from a light-emitting layer can be used as an electron injection electrode (opposite electrode 220). Accordingly, a dual emission light-emitting device capable of extracting light from the light-emitting element 224 above and below can be obtained. Note that the functions of the pixel electrode 216 and the opposite electrode 220 may be replaced with each other.

Note that this embodiment can be arbitrarily combined with other embodiment modes or embodiments.

Embodiment 4

Figure 11:
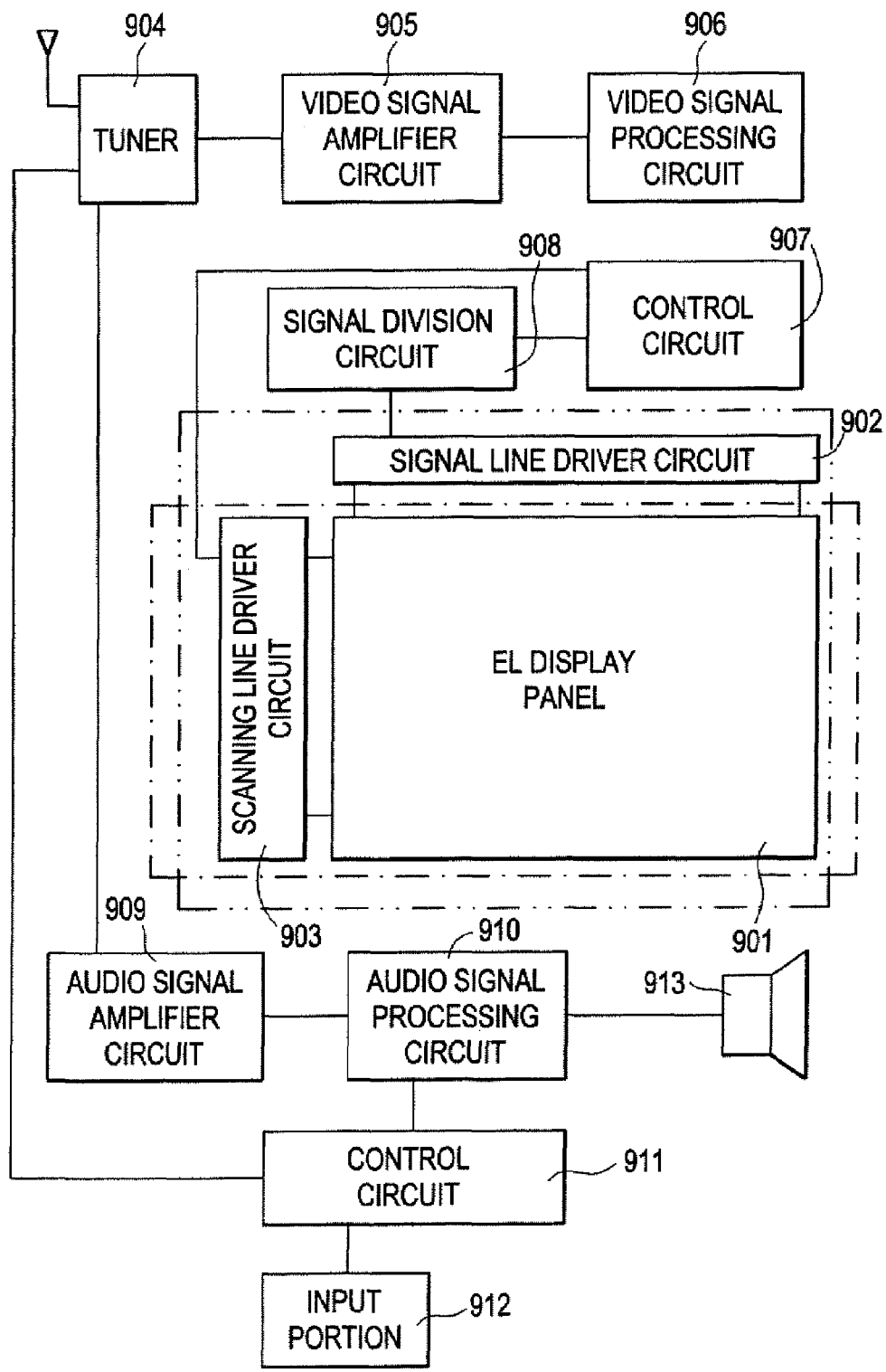
FIG. 11 is a block diagram showing a main structure of a television receiver using a light-emitting device according to a certain aspect of the present invention.

An EL television receiver can be completed using an EL display panel 901 including an active matrix EL light-emitting device manufactured according to Embodiment 3. FIG. 11 shows a block diagram of a main structure of the EL television receiver. The EL display panel 901 can be formed in any manners as follows: in the case where a pixel portion and a scanning line driver circuit 903 of the display panel are integrally formed over a substrate as in Embodiment 3 and further a signal line driver circuit 902 is separately mounted as a driver IC; in the case where only the pixel portion of the display panel is formed, and then the scanning line driver circuit 903 and the signal line driver circuit 902 are mounted by a TAB method; in the case where the pixel portion of the display panel and the scanning line driver circuit 903 and the signal line driver circuit 902 which are peripheral thereof are formed by a COG method; and the like.

Another structure of an external circuit comprises a video signal amplifier circuit 905 which amplifies a video signal received by a tuner 904; a video signal processing circuit 906 which converts the video signal outputted therefrom into a color signal corresponding to each color of red, green, and blue; a control circuit 907 which converts the video signal into an input specification of a driver IC; and the like. The control circuit 907 outputs the signal into the scanning line side and the signal line side, respectively. In the case of digital driving, a signal division circuit 908 is provided on the signal line side so as to have a structure in which an input digital signal is provided dividing into m-pieces.

Among a signal received from the tuner 904, an audio signal is transmitted to an audio signal amplifier circuit 909, and the output thereof is provided for a speaker 913 via an audio signal processing circuit 910. A control circuit 911 receives control information of a receiving station (a receiving frequency) or sound volume from an input portion 912 and transmits the signal to the tuner 904 or the audio signal processing circuit 910.

A television receiver as shown in FIG. 20A can be completed by incorporating such an external circuit and EL display panel 901 into a casing. Of course, the present invention is not limited to the television receiver and is applicable to a display medium with a large-sized area such as an information display board at a station, an airport, or the like, or an advertisement display board on the street as well as a monitor of a personal computer. Note that this embodiment can be arbitrarily combined with other embodiment modes or embodiments.

Embodiment 5

This embodiment describes a method for manufacturing an active matrix liquid crystal display device according to the present invention with reference to FIG. 12, FIGS. 13A to 13C, FIGS. 14A to 14C, FIGS. 15A and 15B, and FIG. 16.

Figure 12:
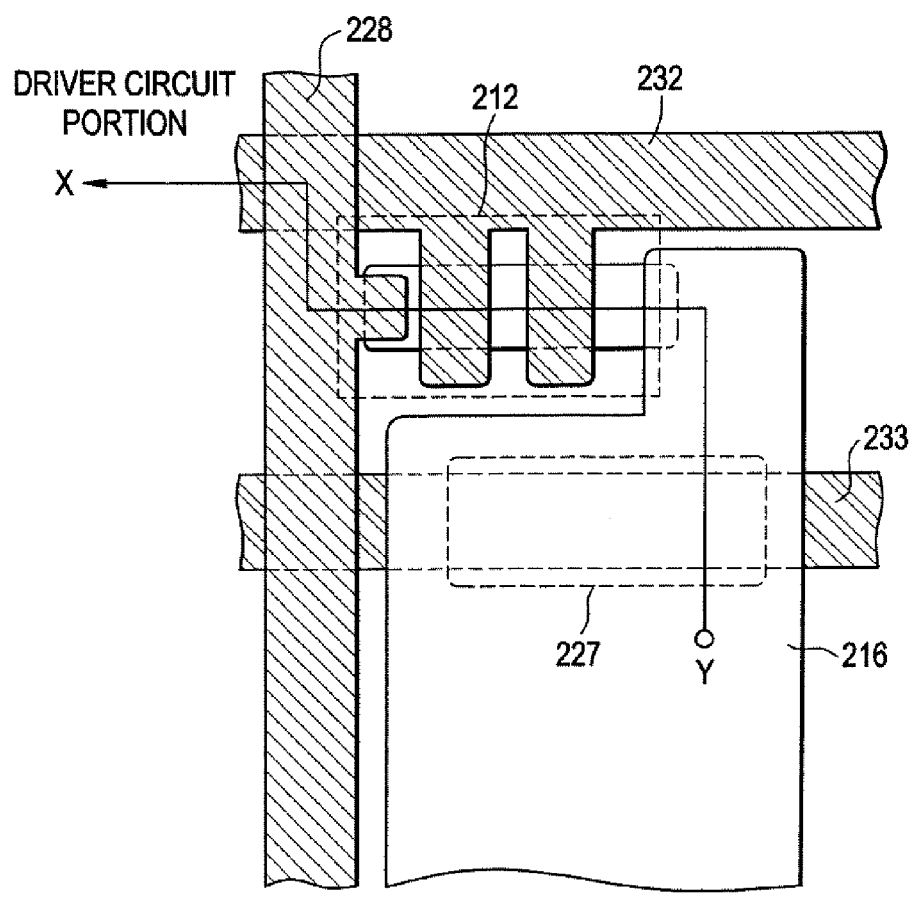
FIG. 12 is a top view of a pixel of a liquid crystal display device according to a certain aspect of the present invention.

FIG. 12 is a top view of one pixel of a liquid crystal display device. Reference numeral 212 denotes a switching TFT, which controls ON/OFF of a current flowing to a pixel. Herein, a multi-gate structure is employed. Reference numeral 228 denotes a source or drain wiring (also referred to as a 2nd wiring); and 233, a capacitor wiring, and a capacitor portion 227 is formed between the capacitor wiring 233 and a pixel electrode 216. Note that the region where the capacitor portion is to be formed is not limited to this region.

A liquid crystal display device and a manufacturing method thereof according to the invention are described with reference to FIGS. 13A to 13C, FIGS. 14A to 14C, and FIGS. 15A and 15B. FIGS. 13A to 13C, FIGS. 14A to 14C, and FIGS. 15A and 15B show cross-sectional structures taken along line X-Y in FIG. 12. This embodiment describes an active matrix EL light-emitting device using a TFT having double-gate electrode layer different in width shown in Embodiment Mode 1; however, the structure of the gate electrode layer is not limited thereto and other embodiment modes or embodiments can be substituted or combined.

First, a base insulating film 118, an island-shaped semiconductor layer 103, a gate insulating film 104, gate electrode layers 230 to 232 are formed over a substrate 100 in the same manner as Embodiment Mode 1 and Embodiment 3 (FIG. 13A). However, a so-called offset structure (also referred to as an Loff structure) in which a low-concentration impurity region is not overlapped with the gate electrode layer 232 is employed only for a switching TFT 212 of a pixel portion 215 in this embodiment. Therefore, the laminated gate electrode layer 232 is formed so that the width of each layer is substantially the same.

In addition, a capacitor wiring 233 in a capacitor portion 227, a wiring 234 connected to the TFTs, and a terminal electrode 235 in a terminal portion 239 connected to an external circuit such as a FPC are formed simultaneously with the gate electrode layers 230 to 232 (FIG. 13A). However, these (wirings and electrode) may also be formed separately.

Then, a low-concentration impurity region 237 is formed by doping an n-type impurity element 236 in the order of from $10^{13}$ atoms/cm$^3$ to $10^{14}$ atoms/cm$^3$ into each island-shaped semiconductor layer 103 by using the gate electrode layers 230 to 232 as masks (FIG. 13B). Note that this low-concentration impurity region 237 ultimately becomes a low-concentration impurity region of the switching TFT 212, but not a low-concentration impurity region of a TFT in a driver circuit portion 214. Herein, arsenic (As), phosphorus (P), or the like can be used as the n-type impurity element.

Each of remaining part as the low-concentration impurity regions of a p-channel TFT 211 in the driver circuit portion 214 and the switching TFT 212 is covered with a resist 200. Then, for example, an n-type impurity element 109 in the order of from $10^{15}$ atoms/cm$^3$ to $10^{17}$ atoms/cm$^3$ is doped into each island-shaped semiconductor layer 103 by using the gate electrode layer 230 and the resist 200 as masks (the resist 200 is desirable to be formed by a droplet discharging method). Accordingly, an n-type impurity region 202 to be a source or drain region is each formed in the island-shaped semiconductor layers of an n-channel TFT 210 in the driver circuit portion 214 and the switching TFT 212 that is not covered with the resist 200. Further, an n-type low-concentration impurity region 203 is formed in a region overlapped with each thinner part of the gate electrode layer. Furthermore, a channel region 204 is formed between the low-concentration impurity regions 203 (FIG. 13C).

On the other hand, only the highly concentrated n-type impurity region 202 to be a source or drain region is formed in the switching TFT 212 (FIG. 13C). Herein, arsenic (As), phosphorus (P), or the like can be used as the n-type impurity element. Thereafter, the resist 200 is removed by $O_2$ ashing or the like.

Then, the regions to be the n-channel TFT 210 in the driver circuit portion 214 and the switching TFT 212 in the pixel portion 215 are covered with a resist 205 (it is desirable to form the resist 205 by a droplet discharging method). Thereafter, a p-type impurity element 206 in the order of from $10^{15}$ atoms/cm$^3$ to $10^{17}$ atoms/cm$^3$ is doped into the island-shaped semiconductor layer of the p-channel TFT 211 by using the gate electrode layer 231 as a mask. Accordingly, a p-type impurity region 207 to be a source or drain region of the p-channel TFT 211 is formed. Further, a p-type low-concentration impurity region 208 is formed in a region overlapped with a thinner part of the gate electrode layer. Furthermore, a channel region 209 is formed therebetween (FIG. 14A). Herein, boron (B) or the like can be used as the p-type impurity element. Thereafter, the resist 205 is removed by $O_2$ ashing or the like.

Note that the impurity element may be activated by heat treatment after performing the above doping.

In this manner, a TFT having a CMOS structure can be obtained in the driver circuit portion 214 having a structure in which a low-concentration impurity region is overlapped with a gate electrode layer (also referred to as a Lov structure), and a TFT having an offset structure in which a low-concentration impurity region is not overlapped with a gate electrode layer (Loff structure) can be obtained in the pixel portion 215.

Then, a cap insulating film 113 covering the TFTs is formed by a plasma CVD method in the same manner as Embodiment 3 (FIG. 14B). It is as desirable to form the cap insulating film 113 as much as possible in order to prevent mixture of impurities from above the TFTs. Further, a passivation film may be formed, and impurities activation and hydrogen treatment may be performed in the same manner as Embodiment 3.

This embodiment further describes a method for forming a contact hole using a liquid-repellent material. First, a liquid-repellent material 240 is formed over a substrate by a droplet discharging method, a spin coating method, a slit coating method, a spray method, or the like, and further a mask 241 made of PVA, polylmide, or the like is formed in a place for forming contact holes (FIG. 14B). A fluorine-based silanecoupling agent such as FAS (fluoroalkylsilane) can be used as the liquid-repellent material. The mask 241 made of PVA, polyimide, or the like may be selectively discharged by a droplet discharging method.

The liquid-repellent material 240 is removed by etching, using PVA or the like as a mask. In addition, the liquid-repellent material 240 can be removed by $O_2$ ashing or atmospheric pressure plasma. Thereafter, the mask is removed by washing treatment in the case of PVA and a peeling solution N300 or the like in the case of polylmide.

Then, an interlayer insulating film 114 (or a planarizing film) is formed by a droplet discharging method, a spin coating method, a slit coating method, or the like with the liquid-repellent material left in a place where the contact holes are formed (FIG. 14C). In this case, since the liquid-repellent material 240 is in the place where the contact holes are formed, the interlayer insulating film is not formed thereover. In addition, there is no fear that the contact holes become a reverse taper shape. It is preferable to form selectively the interlayer insulating film 114 by a droplet discharging method. It is formed by using an organic resin such as acrylic, polyimide, or polyamide; an inorganic siloxane-based insulating film, among compounds formed of silicon, oxygen, and hydrogen, including the Si—O—Si bond; an organic siloxane-based insulating film, among the compounds, in which hydrogen bonded with silicon is substituted by an organic group such as methyl or phenyl; or the like. The liquid-repellent material 240 is removed by $O_2$ ashing or atmospheric pressure plasma after forming the interlayer insulating film 114. Note that when a passivation film is formed, the passivation film is also removed.

Thereafter, a pixel electrode 216 is formed before forming a wiring 228, which connects the TFTs, the TFT and the pixel electrode 216, and the TFT and a wiring 234 (FIG. 15A). A transparent conductive material such as ITO or ITSO, or a reflective conductive material such as MgAg is selected for the pixel electrode 216 depending on whether the pixel electrode 216 is light-transmitting or not. In addition, the same material as in Embodiment 3 can be used for the wiring 228. The pixel electrode 216 and the wiring 228 are desirable to be formed by a droplet discharging method. When there is a cap insulating film or the like above a terminal electrode 235, the cap insulating film is removed by using the interlayer insulating film 114 or the like as a mask.

Through the steps mentioned above, an active matrix TFT substrate is completed. Further, FIG. 15B shows that a liquid crystal layer 251 is sandwiched between the TFT substrate and an opposite substrate 250 and sealed with a sealant 252. A column-shape spacer 253 is formed over the TFT substrate. The column-shape spacer 253 is preferably formed in accordance with a depression of a contact portion formed over the pixel electrode. Although depending on a liquid crystal material to be used, the column-shape spacer 253 is formed to have a height of from 3 μm to 10 μm. Since a depression corresponding to each contact hole is formed in a contact portion, disorder of liquid crystal orientation can be prevented by forming a spacer in accordance with this portion.

An orientation film 254 is formed over the TFT substrate and rubbing treatment is performed. A transparent conductive film 255 and the orientation film 254 are formed for the opposite substrate 250. Thereafter, a liquid crystal is injected after attaching the TFT substrate and the opposite substrate 250 by the sealant 252, and the liquid crystal layer 251 is formed.

Figure 16:
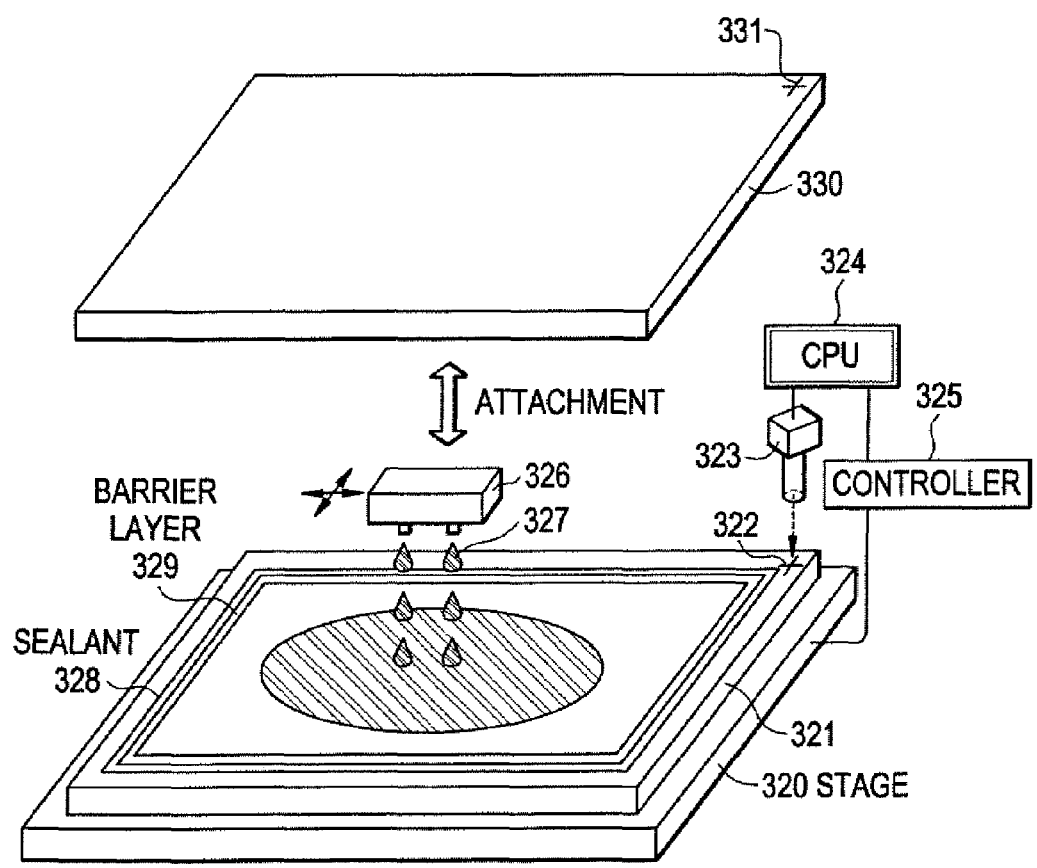
FIG. 16 is an explanatory view of a liquid crystal dropping method.

The both substrates are attached by sandwiching the sealant 252 therebetween. Thereafter, the liquid crystal layer 251 can be formed by using a dipping method in which one side of the sealed substrates (cells) provided with a liquid crystal inlet is dipped in a liquid crystal and injected inside of the cells due to a capillary phenomenon (a suction method), or by using a liquid crystal dropping method shown in FIG. 16. FIG. 16 shows a so-called liquid crystal dropping method in which a liquid crystal is dropped from a nozzle (dispenser) 326 to one substrate 321 provided with a sealant 328 and a barrier layer 329 and then an opposite substrate 330 is attached. The liquid crystal dropping method is an effective means particularly when a substrate becomes larger. Note that the barrier layer 329 in FIG. 16 is provided to prevent chemical reaction between liquid crystal molecules 327 and the sealant 328. In the case of attaching the both substrates, it is performed by detecting an alignment marker 322 or 331 which is formed in the both substrates in advance with an imaging means 323 and by controlling a stage 320 where the both substrates are disposed with a CPU 324 and a controller 325.

Then, an FPC (Flexible Print Circuit) 256 is attached to the terminal electrode 235 with an anisotropic conductive film 257 by a known method.

Through the steps mentioned above, an active matrix LCD device including the pixel portion 215, the driver circuit portion 214, the terminal portion 239, and the capacitor portion 227 is completed (FIG. 15B). Note that a semiconductor device according to the invention is used for the driver circuit portion in this embodiment; however, the semiconductor device may also be used for other regions (for example, the pixel portion). Note that this embodiment can be arbitrarily combined with other embodiment modes or embodiments.

Embodiment 6

Figure 17:
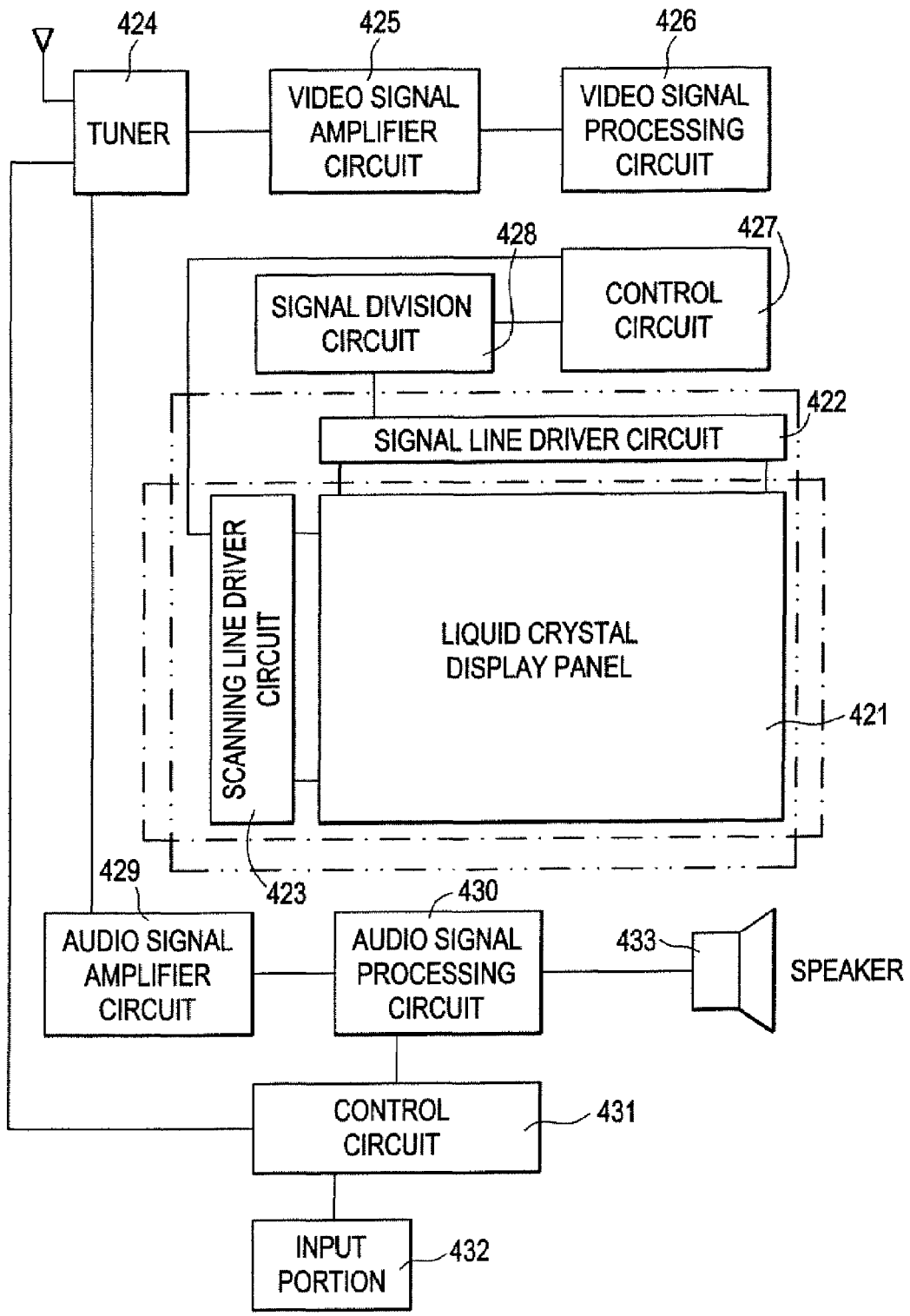
FIG. 17 is a block diagram showing a main structure of a television receiver using a liquid crystal display device according to a certain aspect of the present invention.

A liquid crystal television receiver can be completed using a liquid crystal display panel 421 including an active matrix LCD light-emitting device manufactured according to Embodiment 5. FIG. 17 shows a block diagram of a main structure of the liquid crystal television receiver. The liquid crystal display panel 421 can be formed in any manners as follows: in the case where a pixel portion and a scanning line driver circuit 423 of the display panel are integrally formed over a substrate as in Embodiment 3 and further a signal line driver circuit 422 is separately mounted as a driver IC; in the case where only the pixel portion of the display panel is formed, and then the scanning line driver circuit 423 and the signal line driver circuit 422 are mounted by a TAB method; in the case where the pixel portion of the display panel and the scanning line driver circuit 423 and the signal line driver circuit 422 which are peripheral thereof are formed by a COG method; and the like.

Another structure of an external circuit comprises a video signal amplifier circuit 425 which amplifies a video signal received by a tuner 424; a video signal processing circuit 426 which converts the video signal outputted therefrom into a color signal corresponding to each color of red, green, and blue; a control circuit 427 which converts the video signal into an input specification of a driver IC; and the like. The control circuit 427 outputs the signal into the scanning line side and the signal line side, respectively. In the case of digital driving, a signal division circuit 428 is provided on the signal line side so as to have a structure in which an input digital signal is provided dividing into m-pieces.

Among a signal received from the tuner 424, an audio signal is transmitted to an audio signal amplifier circuit 429, and the output thereof is provided for a speaker 433 via an audio signal processing circuit 430. A control circuit 431 receives control information of a receiving station (a receiving frequency) or sound volume from an input portion 432 and transmits the signal to the tuner 424 or the audio signal processing circuit 430.

A television receiver as shown in FIG. 20A can be completed by incorporating such an external circuit and liquid crystal display panel 421 into a casing. Of course, the present invention is not limited to the television receiver and is applicable to a display medium with a large-sized area such as an information display board at a station, an airport, or the like, or an advertisement display board on the street as well as a monitor of a personal computer. Note that this embodiment can be arbitrarily combined with other embodiment modes or embodiments.

Embodiment 7

Figure 18:
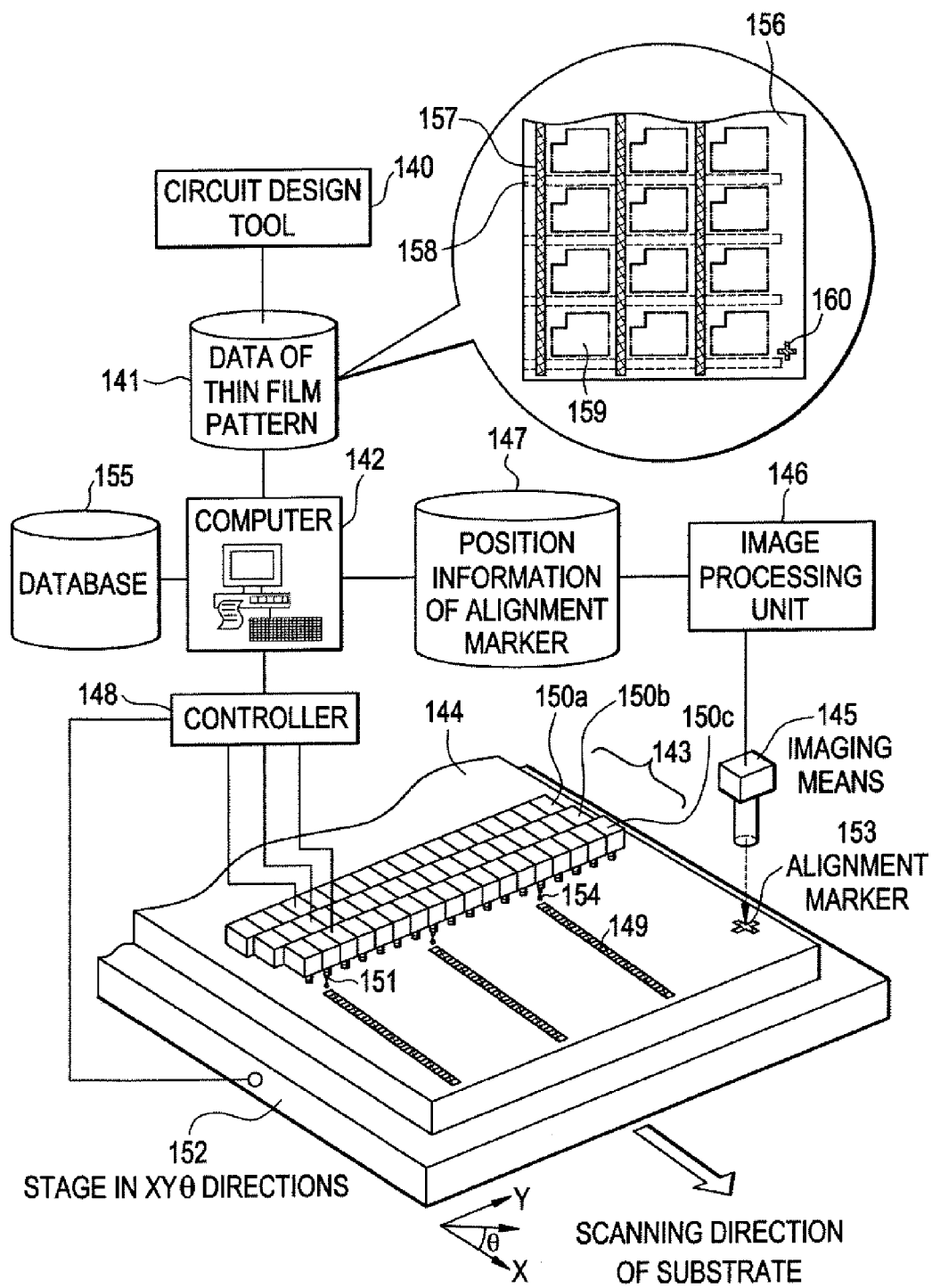
FIG. 18 is an explanatory view of a droplet discharging system.

This embodiment describes a method for manufacturing each composition for forming a gate electrode layer or the like by using a droplet discharging system in a structure of a semiconductor device according to the present invention and a manufacturing method thereof with reference to FIG. 18. FIG. 18 is a schematic view of the droplet discharging system.

First, a circuit design is performed, and a desired layout of a thin film and an alignment marker is determined by a circuit design tool 140 such as a CAD, a CAM, a CAE, or the like.

Data 141 of a thin film pattern including a designed layout of a thin film and an alignment marker is inputted into a computer 142 for controlling a droplet discharging device via an information network such as a memory medium or a LAN (Local Area Network). Based on the data 141 of a thin film pattern, a nozzle having an outlet with an optimum diameter, which stores a composition including a material for forming the thin film, or which is connected to a tank for storing the composition, is selected among other nozzles (an unit for spraying liquids or gasses from a fine-ended opening) of a droplet discharging means 143; then, a scanning path (moving path) of the droplet discharging means 143 is determined. In the case where an optimum nozzle has been determined in advance, only a moving path of the nozzle may be determined.

An alignment marker 153 is formed by photolithography technique or laser light over a substrate 144 where the thin film is to be formed. The substrate provided with an alignment marker is put on a stage 156 in the droplet discharging device, and the position of the alignment marker is detected by an imaging means 145 installed in the device, then, it is inputted as position information 147 into the computer 142 via an image processing unit 146. The computer 142 verifies the data 141 of the thin film pattern designed by a CAD or the like and the position information 147 of the alignment marker obtained by the imaging means 145 to perform alignment of the substrate 144 and the droplet discharging means 143.

Thereafter, the droplet discharging means 143, controlled by a controller 148, discharges a composition 154 according to the determined scanning path, and a desired thin film pattern 149 is formed. The discharge amount can be appropriately controlled by selecting the outlet diameter. However, the discharge amount is slightly varied by several conditions such as the moving speed of the outlet, the distance between the outlet and the substrate, the discharge speed of a composition, the atmosphere of the discharge space, the temperature or humidity of the discharge space, or the like. Therefore, it is desirable to control these conditions. Optimum conditions are preferably identified in advance by experiments or evaluations, and these results are preferably stored in a database 155 per materials of the composition.

A circuit diagram or the like of an active matrix TFT substrate used for a liquid crystal display device, an EL display device, or the like can be given as an example of a thin film pattern data. FIG. 18 shows a schematic view of a circuit diagram in a circle for showing a conductive film used for such an active matrix TFT substrate. Reference numeral 157 denotes a so-called gate wiring; 158, a source signal line (second wiring); 159, a pixel electrode, a hole injection electrode, or an electron injection electrode; 156, a substrate; and 160, an alignment marker. Of course, the thin film pattern 809 corresponds to the gate wiring 157 in thin film pattern information.

In addition, the droplet discharging means 143 here has an integrated structure of a plurality of nozzles 150a to 150c; however, the structure is not limited thereto. Each nozzle has a single or a plurality of outlets 151. The above thin film pattern 149 is formed by selecting a predetermined outlet 151 from the nozzles 150a to 150c.

The droplet discharging means 143 is desirable to be provided with a plurality of nozzles having different outlets, discharge amount, or nozzle pitches to be able to manufacture thin film patterns having various line widths and to improve tact time. The distances between the outlets are desirable to be narrow as much as possible. In addition, a nozzle having a length of 1 m or more is desirable to be provided for the droplet discharging means 143 to perform high throughput discharge over a substrate having a size of from 1×1 m or more. The droplet discharging means 143 may be retractable to be able to control arbitrarily the distance between the outlets. The nozzle or a head may be leaned in order to obtain high resolution, in other words, to depict a smooth pattern. Accordingly, the drawing on a large area such as a rectangular shape becomes possible.

Nozzles of the head having different pitches may be provided for one head in parallel. In this case, outlet diameters may be the same or different.

In the case of the droplet discharging device using a plurality of nozzles as mentioned above, it is required that a waiting position for a nozzle not in use is provided. The waiting position can be provided with a gas supplying means and a showerhead to substitute the atmosphere in the waiting position for the atmosphere that is the same as the gas of a solvent of the composition. Accordingly, the desiccation can be prevented at some level. Furthermore, a clean unit or the like that supplies clean air to reduce dust in a work place may be provided.

In the case that the distances between outlets cannot be narrowed due to the specifications of the nozzle 150a to 150c, the pitch of a nozzle may be designed to be integer multiple of a pixel in a display device. Therefore, a composition can be discharged over the substrate 144 by shifting the nozzles 150a to 150c. A camera using a semiconductor element that converts the strong and weak of light to an electric signal such as a CCD (charge coupled device) is preferably used as the imaging means 145.

The above is the method for forming a thin film pattern 149 by fixing a stage 152, which places the substrate 144 thereon, and by scanning the substrate 144 along with the determined path. On the other hand, the thin film pattern 149 may also be formed by fixing the droplet discharging means 143 and scanning the stage 152 in XYθ directions along with a path determined by the data 141 of a thin film pattern. In the case where the droplet discharging means 143 has a plurality of nozzles, it is required to determine a nozzle having an outlet with an optimum diameter, which stores a composition containing a material for forming the thin film or which is connected to a tank for storing the composition.

In addition, the above method uses only one predetermined outlet of the nozzle 150c to form the thin film pattern 149. Alternatively, a plurality of outlets may be used to discharge the composition depending on the line width and film thickness of the thin film to be formed.

A plurality of nozzles having redundancy may be used. For example, when the nozzle 150a (or 150b) discharges the composition first, discharge conditions may be controlled so that the nozzle 150c discharges the same composition simultaneously. Accordingly, the composition can be discharged from the back nozzle 150c even when the front nozzle 150a has some troubles such as the blockage in the outlet; therefore, it becomes possible at least to prevent wirings from breaking or the like.

In addition, a planarizing thin film can be formed in much shorter tact time by controlling the discharge conditions so that the composition is discharged from a plurality of the nozzles having different outlet diameters. This method is suitable especially for forming such a thin film that a discharge area of a composition is large and the planarity is required like a pixel electrode in a LCD.

Further, a pattern having different line widths of wirings can be formed at a time by controlling the discharge conditions so that the composition is discharged from a plurality of the nozzles having different outlet diameters.

The composition can be filled in an opening portion high in aspect ratio, which is partially formed in an insulating film, by controlling the discharge condition so that the composition is discharged from a plurality of the nozzles having different outlet diameters. According to this method, voids (wormholes opened between the insulating film and a wiring) can be prevented, which enables the formation of a planarized wiring.

As mentioned above, a droplet discharging system used for forming a thin film or a wiring comprises an inputting means for inputting data for showing a thin film pattern; a setting means for setting a moving path of a nozzle for discharging a composition containing a material for forming the thin film; an imaging means for detecting an alignment marker formed over a substrate; and a controlling means for controlling moving path of the nozzle. Therefore, a nozzle or a moving path of a substrate in droplet discharging is required to be accurately controlled. Conditions such as a moving speed of a substrate or a nozzle, a discharge amount, a spray distance, a spray speed, a discharge atmosphere, a discharge temperature, a discharge humidity, a heating temperature for a substrate, or the like can be accurately controlled by loading a program for controlling conditions for discharging a composition into a computer for controlling the droplet discharging system.

Accordingly, a thin film or a wiring having a desired width, thickness, and shape can be manufactured with accuracy at a desired place within a short tact time and a high throughput. Furthermore, manufacturing yields of an active element like a TFT manufactured by using the thin film or the wiring; a liquid crystal display (LCD), a light-emitting device such as an organic EL display, an LSI, or the like manufactured by using the active element can be improved. Particularly, according to the invention, a thin film or a wiring can be formed at an optional place, and a width, a thickness, and a shape of the pattern can be adjusted. Therefore, a large-sized active element substrate can also be manufactured at low costs in high yields.

Embodiment 8

Figure 20B:
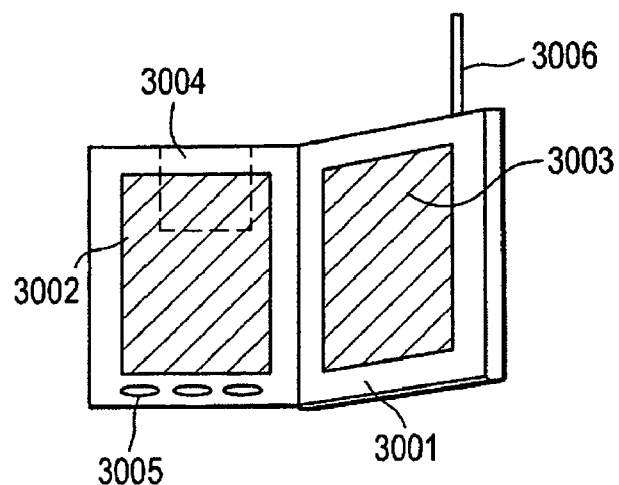
Figure 20C:
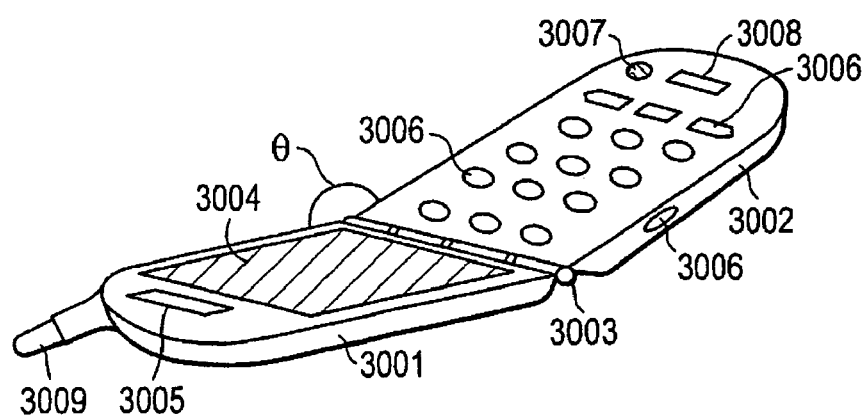

A television receiver, a portable book (electronic book), and a cellular phone shown in FIGS. 20A to 20C can be completed as one example of electronic devices in which an EL light-emitting device and a liquid crystal display device mentioned in above embodiments are used.

FIG. 20A shows the television receiver, which incorporate a display module 2002 manufactured by utilizing a liquid crystal or an EL element into a casing 2001. Not only an ordinary television broadcasting can be received by a receiver 2005, but also it becomes possible to perform one-way information communication (from a transmitter to a receiver) or a two-way information communication (between a transmitter and a receiver, or between receivers) by connecting the television receiver to a wired or wireless communication network via a modem 2004. The television receiver can be operated by a switch incorporated into the casing or a remote control unit 2006 separately provided. This remote control unit may also be provided with a display portion 2007 to display information to be outputted.

In addition, the television receiver may be provided with a sub screen 2008 formed as a second display module as well as a main screen 2003, and a structure that displays channels or sound volumes may also be provided. In this structure, the main screen 2003 may be formed by an EL display module having an excellent viewing angle and the sub screen 2008 may be formed by a liquid crystal module capable of displaying at low power consumption. Furthermore, in order to put a priority on the low power consumption, a structure in which the main screen 2003 is formed of a liquid crystal display module and the sub screen 2008 is formed of an EL display module so that the sub screen 2008 can be turned ON and OFF may be employed.

Of course, the present invention is not limited to the television receiver and is applicable particularly to a display medium with a large-sized area such as an information display board at a station, an airport, or the like, or an advertisement display board on the street as well as a monitor of a personal computer. Not only receiving an image, the invention is also applicable to a device capable of a two-way communication like a digital television.

FIG. 20B shows a portable book (electronic book), which includes a main body 3101, display portions 3102 and 3103, a recording medium 3104, operation switches 3105, an antenna 3106, and the like.

FIG. 20C shows a cellular phone, and reference numeral 3001 denotes a display panel; and 3002, an operation panel. The display panel 3001 and the operation panel 3002 are connected to each other by a connection portion 3003. An angle θ between a surface where a display portion 3004 of the display panel 3001 is provided and a surface where operation keys 3006 of the operation panel 3002 is provided can be arbitrarily changed. Furthermore, an audio output portion 3005, the operation keys 3006, a power switch 3007, an audio input portion 3008, an antenna 3009, and the like are provided.

In addition, the present invention has a feature to include a gate electrode layer having a single layer structure or a laminated structure of which film thickness is not even, and such gate electrode layer can be formed easily by particularly employing a droplet discharging method; thus, the convenience of the droplet discharging method can be taken with full advantage. Furthermore, a TFT having a Lov structure can be manufactured easily by having a feature of the invention to include a gate electrode layer having a single layer structure or a laminated structure of which film thickness is not even.

A semiconductor device according to the invention, and a light-emitting device and a liquid crystal display device utilizing the semiconductor device each has such a structure that the number of steps and the material cost can be reduced, and a droplet discharging method can be actively employed. Therefore, the above devices can be manufactured with fewer steps, low cost, high throughput, high yields, and short tact time. The invention is significant in requiring the low cost and high quality; thus, the industrial applicability is extremely high.

The present application is based on Japanese Patent Application serial No. 2004-122388 filed on Apr. 19, 2004 with the Japanese Patent Office, the entire contents of which are hereby incorporated by reference.

What is claimed is:

1. A method for manufacturing a semiconductor device comprising:
    forming a gate insulating film over a semiconductor layer;
    forming a plurality of gate electrode layers different in width and laminated on each other over the gate insulating film;
    heating the plurality of gate electrode layers in an atmosphere containing oxygen and nitrogen to reduce thickness and width of the plurality of gate electrode layers; and
    forming a source region and a drain region and a pair of low-concentration impurity regions by introducing impurities into the semiconductor layer, using the plurality of gate electrode layers as masks,
    wherein the pair of low-concentration impurity regions is formed to overlap with part of the plurality of gate electrode layers where the film thickness is reduced, and
    wherein each of the gate electrode layers is formed by ink-jet.

2. A method according to claim 1, wherein the gate electrode layer is formed to be in contact with a hydrophilic film.

3. A method for manufacturing a semiconductor device according to claim 1, wherein the gate electrode layer at least contains one kind selected from Ag, Cu, Au, Al, Al—Si, Ni, NiB, W, W—Si, TaN, Ti, and TiN.

4. An EL display device comprising a semiconductor device manufactured by a method according to claim 1, wherein the manufactured semiconductor device is included in one or both of a pixel portion and a driver circuit portion of the EL display device.

5. A liquid crystal display device comprising a semiconductor device manufactured by as method according to claim 1, wherein the manufactured semiconductor device is included in one or both of a pixel portion and a driver circuit portion of the liquid crystal display device.

6. A method for manufacturing a semiconductor device according to claim 1 wherein a side part of each of the gate electrode layers is round.

7. A method for manufacturing a semiconductor device according to claim 1 wherein the gate electrode layers comprises respective materials, and wherein each of the materials is jetted from a nozzle to be shaped into corresponding one of the gate electrode layers.

8. A method for manufacturing a semiconductor device according to claim 1 further comprising forming a source electrode and a drain electrode over the source region and the drain region respectively by ink-jet.

9. A method for manufacturing a semiconductor device comprising:
    forming a gate insulating film over a semiconductor layer;
    forming a gate electrode layer over the gate insulating film;
    forming a heat-resistant insulator over the first shape gate electrode layer;
    heating the first shape gate electrode layer in an atmosphere containing oxygen and nitrogen to reduce thickness of part of the first shape gate electrode layer where the insulator is not formed to form a second shape gate electrode layer;
    forming a source region and a drain region and a pair of low-concentration impurity regions by introducing impurities into the semiconductor layer, using the second shape gate electrode layer as a mask; and
    forming a source electrode and a drain electrode over the source region and the drain region respectively by ink-jet,
    wherein the pair of low-concentration impurity regions is formed to overlap with a thinner part of the second shape gate electrode layer.

10. A method according to claim 9, wherein the gate electrode layer is formed to be in contact with a hydrophilic film.

11. A method for manufacturing a semiconductor device according to claim 9, wherein the gate electrode layer at least contains one kind selected from Ag, Cu, Au, Al, Al—Si, Ni, NiB, W, W—Si, TaN, Ti, and TiN.

12. An EL display device comprising a semiconductor device manufactured by a method according to claim 9, wherein the manufactured semiconductor device is included in one or both of a pixel portion and a driver circuit portion of the EL display device.

13. A liquid crystal display device comprising a semiconductor device manufactured by a method according to claim 9, wherein the manufactured semiconductor device is included in one or both a pixel portion and a driver circuit portion of the liquid crystal display device.

14. A method for manufacturing a semiconductor device according to claim 9 wherein the first shape gate electrode layer is formed by ink-jet.

15. A method for manufacturing a semiconductor device according to claim 9 wherein a material of the first shape gate electrode layer is jetted from a nozzle to be shaped into the first shape gate electrode layer.

16. A method for manufacturing a semiconductor device comprising:
    forming a gate insulating film over a semiconductor layer;
    forming a first shape gate electrode layer over the gate insulating film;
    forming a heat-resistant insulator over the first shape gate electrode layer;
    heating the first shape gate electrode layer in an atmosphere containing oxygen and nitrogen to reduce thickness of part of the first shape gate electrode layer where the insulator is not formed to form a second shape gate electrode layer; and
    forming a pair of impurity regions and a pair of low-concentration impurity regions by introducing impurities into the semiconductor layer, using the second shape gate electrode layer as a mask,
    wherein the pair of low-concentration impurity regions is formed to overlap with a thinner part of the second shape gate electrode layer.

17. A method according to claim 16, wherein a composition of oxygen in the atmosphere is from 10% to 25%.

18. A method according to claim 16, wherein the gate electrode layer is formed to be in contact with a hydrophilic film.

19. A method for manufacturing a semiconductor device according to claim 16, wherein the gate electrode layer at least contains one kind selected from Ag, Cu, Au, Al, Al—Si, Ni, NiB, W, W—Si, TaN, Ti, and TiN.

20. An EL display device comprising a semiconductor device manufactured by a method according to claim 16, wherein the manufactured semiconductor device is included in one or both a pixel portion and a driver circuit portion of the EL display device.

21. A liquid crystal display device comprising a semiconductor device manufactured by a method according to claim 16, wherein the manufactured semiconductor device is included in one or both a pixel portion and a driver circuit portion of the liquid crystal display device.

22. A method for manufacturing a semiconductor device comprising:
  forming a gate insulating film over a semiconductor layer;
  forming a first shape gate electrode layer over the gate insulating film;
  forming a pair of impurity regions by introducing impurities into the semiconductor layer using the first shape gate electrode layer as a mask;
  heating the first shape gate electrode layer in an atmosphere containing oxygen and nitrogen to reduce thickness and width of the first shape gate electrode layer to form a second gate electrode layer reduced in thickness and width; and
  forming a pair of low-concentration impurity regions by introducing impurities at low concentration into the semiconductor layer using the second shape gate electrode layer reduced in thickness and width as a mask.

23. A method according to claim 22, wherein a composition of oxygen in the atmosphere is from 10% to 25%.

24. A method according to claim 22, wherein the gate electrode layer is formed to be in contact with a hydrophilic film.

25. A method for manufacturing a semiconductor device according to claim 22, wherein the gate electrode layer at least contains one kind selected from Ag, Cu, Au, Al, Al—Si, Ni, NiB, W, W—Si, TaN, Ti, and TiN.

26. An EL display device comprising a semiconductor device manufactured by a method according to claim 22, wherein the manufactured semiconductor device is included in one or both of a pixel portion and a driver circuit portion of the EL display device.

27. A liquid crystal display device comprising a semiconductor device manufactured by a method according to claim 22, wherein the manufactured semiconductor device is included in one or both of a pixel portion and a driver circuit portion of the liquid crystal display device.

* * * * *